United States Patent
Hirano et al.

(10) Patent No.: US 9,695,509 B2
(45) Date of Patent: Jul. 4, 2017

(54) SUBSTRATE PROCESSING APPARATUS, PURGING APPARATUS, METHOD OF MANUFACTURING SEMICONDUCTOR DEVICE, AND RECORDING MEDIUM

(71) Applicant: HITACHI KOKUSAI ELECTRIC INC., Tokyo (JP)

(72) Inventors: Makoto Hirano, Toyama (JP); Akinari Hayashi, Toyama (JP)

(73) Assignee: HITACHI KOKUSAI ELECTRIC INC., Tokyo (JP)

(*) Notice: Subject to any disclaimer, the term of this patent is extended or adjusted under 35 U.S.C. 154(b) by 663 days.

(21) Appl. No.: 14/041,447

(22) Filed: Sep. 30, 2013

(65) Prior Publication Data

US 2014/0112739 A1  Apr. 24, 2014

(30) Foreign Application Priority Data

Oct. 23, 2012 (JP) .................... 2012-233690
Sep. 6, 2013 (JP) .................... 2013-185174

(51) Int. Cl.
| | | |
|---|---|---|
| H01L 21/677 | (2006.01) | |
| C23C 16/44 | (2006.01) | |
| H01L 21/67 | (2006.01) | |
| H01L 21/673 | (2006.01) | |

(52) U.S. Cl.
CPC .... C23C 16/4408 (2013.01); H01L 21/67017 (2013.01); H01L 21/67393 (2013.01); H01L 21/67757 (2013.01); H01L 21/67769 (2013.01); H01L 21/67772 (2013.01); Y10T 137/8593 (2015.04)

(58) Field of Classification Search
CPC ......... H01L 21/67017; H01L 21/67757; H01L 21/67769; H01L 21/67393; C23C 16/4408
USPC ........................................ 414/217
See application file for complete search history.

(56) References Cited

U.S. PATENT DOCUMENTS

| | | | |
|---|---|---|---|
| 7,521,089 B2 * | 4/2009 | Hillman .............. | C23C 16/4408 118/719 |
| 2006/0156979 A1 * | 7/2006 | Thakur ............. | C23C 16/45546 118/715 |
| 2009/0044749 A1 * | 2/2009 | Ozaki ............... | H01L 21/67757 118/698 |
| 2009/0061643 A1 | 3/2009 | Takeyama et al. | |
| 2009/0272461 A1 * | 11/2009 | Alvarez, Jr. ...... | H01L 21/67017 141/64 |
| 2010/0035437 A1 * | 2/2010 | Yamazaki ............. | C23C 16/405 438/758 |

(Continued)

FOREIGN PATENT DOCUMENTS

| | | |
|---|---|---|
| JP | 2011-061156 A | 3/2011 |
| JP | 2012-099594 A | 5/2012 |

(Continued)

Primary Examiner — Michael McCullough
Assistant Examiner — Mark Hageman
(74) Attorney, Agent, or Firm — Volpe and Koenig, P.C.

(57) ABSTRACT

A substrate processing apparatus includes a processing vessel configured to process a substrate; a first purging part configured to perform a first purge to supply inert gas at a first flow rate into a substrate container accommodating the substrate; and a second purging part configured to perform a second purge to supply inert gas at a second flow rate into the substrate container, the second flow rate being lower than the first flow rate.

13 Claims, 16 Drawing Sheets

(56) References Cited

U.S. PATENT DOCUMENTS

| | | | |
|---|---|---|---|
| 2010/0068893 A1* | 3/2010 | Kato | C23C 16/345 438/758 |
| 2010/0210118 A1 | 8/2010 | Mizuno | |
| 2012/0052203 A1* | 3/2012 | Miyashita | C23C 16/4408 427/248.1 |
| 2012/0269603 A1* | 10/2012 | Toba | H01L 21/67757 414/160 |
| 2013/0319332 A1* | 12/2013 | Gokon | H01L 21/02104 118/722 |

FOREIGN PATENT DOCUMENTS

| | | |
|---|---|---|
| TW | 200644122 A | 12/2006 |
| TW | 201041036 A1 | 11/2010 |

\* cited by examiner

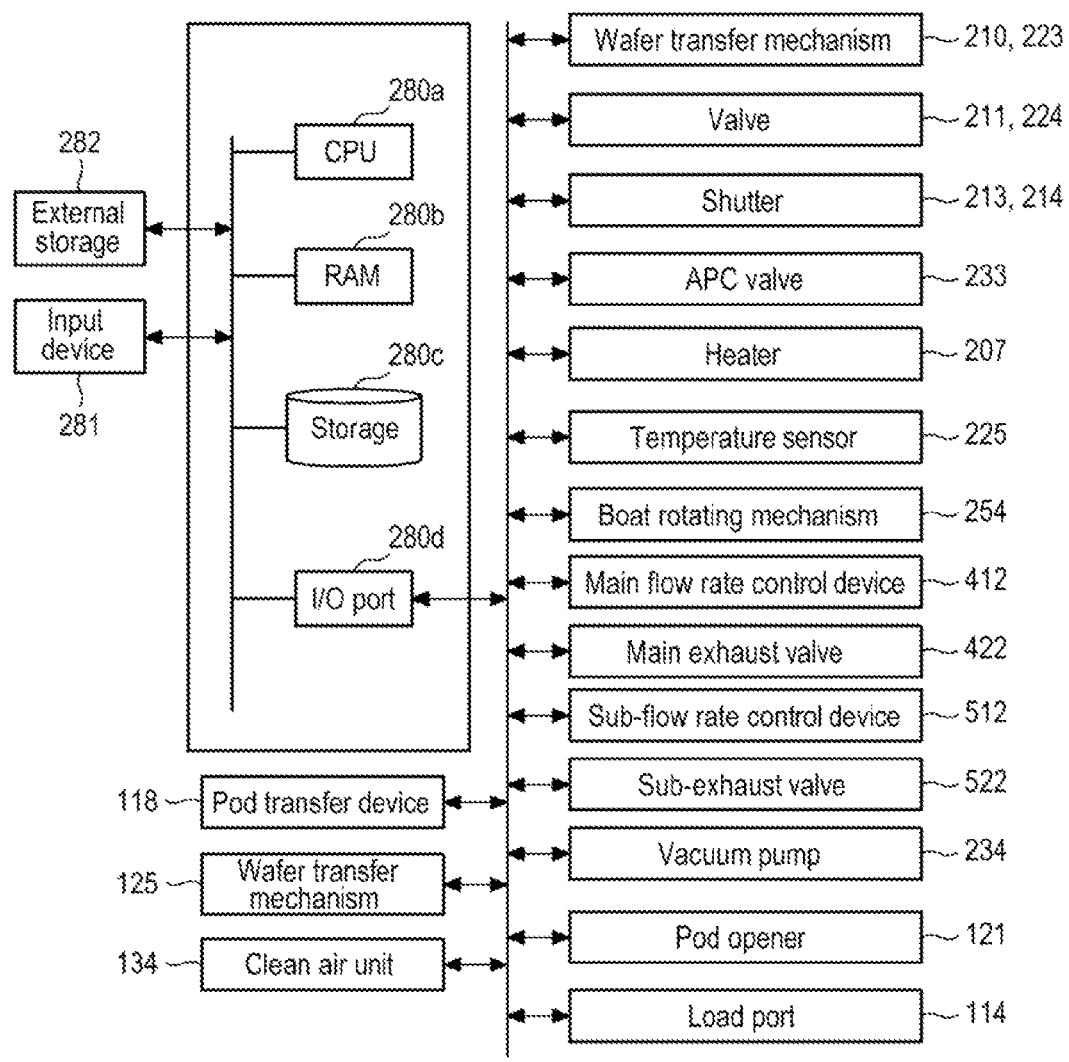

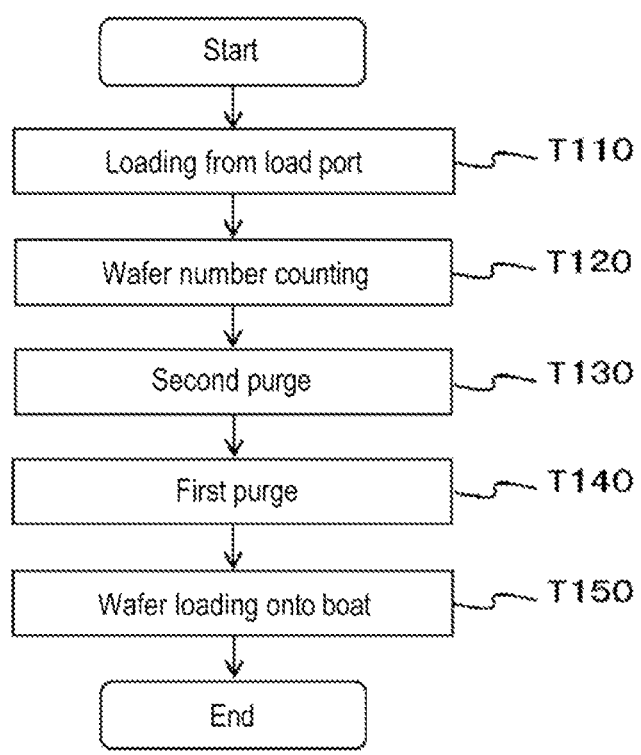

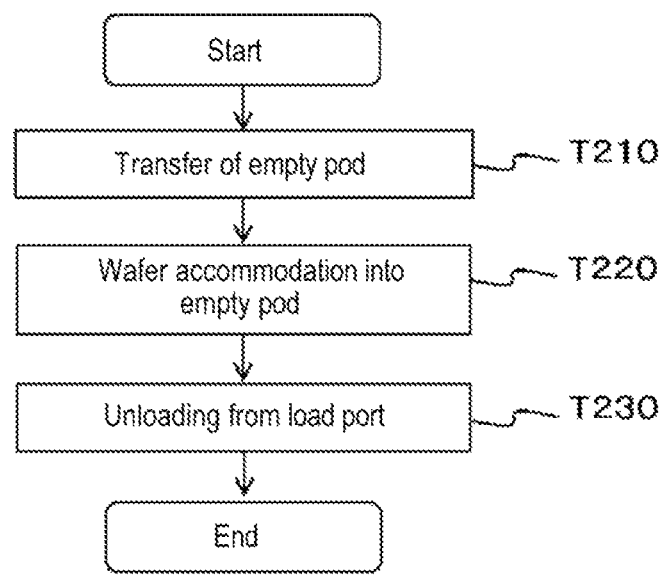

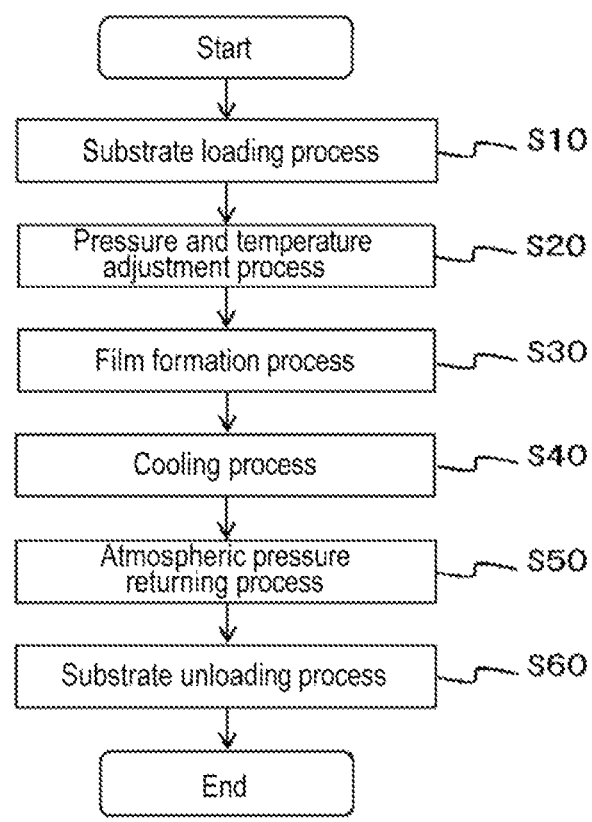

SUBSTRATE PROCESSING APPARATUS, PURGING APPARATUS, METHOD OF MANUFACTURING SEMICONDUCTOR DEVICE, AND RECORDING MEDIUM

CROSS-REFERENCE TO RELATED APPLICATIONS

This application is based upon and claims the benefit of priority from Japanese Patent Application Nos. 2012-233690, filed on Oct. 23, 2012, and 2013-185174, filed on Sep. 6, 2013, the entire contents of which are incorporated herein by reference.

TECHNICAL FIELD

The present disclosure relates to a substrate processing apparatus, a purging apparatus, a method of manufacturing a semiconductor device, and a recording medium.

BACKGROUND

In a processing apparatus for manufacturing semiconductor devices such as large scale integrated (LSI) circuits and the like, oxygen concentration in the processing apparatus or in a pod which is transferred into the processing apparatus is reduced in order to suppress formation of natural oxide films on a substrate which is being processed.

However, it is difficult for the processing apparatus configured as above to provide a high quality semiconductor device and high throughput of manufacturing a semiconductor device while suppressing formation of natural oxide films, which are in high demand by recent miniaturizing techniques.

SUMMARY

The present disclosure provides some embodiments of a substrate processing apparatus, a purging apparatus, a method of manufacturing a semiconductor device, and a recording medium, which are capable of improving quality and manufacture throughput of semiconductor devices while suppressing formation of a natural oxide film.

According to one embodiment of the present disclosure, provided is a substrate processing apparatus including a processing vessel configured to process a substrate; a first purging part configured to perform a first purge to supply inert gas at a first flow rate into a substrate container accommodating the substrate; and a second purging part configured to perform a second purge to supply inert gas at a second flow rate into the substrate container, the second flow rate being lower than the first flow rate.

According to another embodiment of the present disclosure, provided is a purging apparatus including a first purging part configured to perform a first purge to supply inert gas at a first flow rate into a substrate container accommodating a substrate; and a second purging part configured to perform a second purge to supply inert gas at a second flow rate into the substrate container, the second flow rate being lower than the first flow rate.

According to yet another embodiment of the present disclosure, provided is a method of manufacturing a semiconductor device, including performing a first purge in a first purging part to supply inert gas at a first flow rate into a substrate container accommodating a substrate; transferring the substrate container from the first purging part to a second purging part; and performing a second purge in the second purging part to supply inert gas at a second flow rate into the substrate container, the second flow rate being lower than the first flow rate.

According to still another embodiment of the present disclosure, provided is a non-transitory computer-readable recording medium storing a program that causes a computer to perform a process including performing a first purge in a first purging part to supply inert gas at a first flow rate into a substrate container accommodating a substrate; transferring the substrate container from the first purging part to a second purging part; and performing a second purge in the second purging part to supply inert gas at a second flow rate into the substrate container, the second flow rate being lower than the first flow rate.

BRIEF DESCRIPTION OF THE DRAWINGS

FIG. 6 shows a block diagram of a controller in the substrate processing apparatus suitable for use in an embodiment of the present disclosure.

FIG. 7 is a flow chart illustrating a transfer-in process of a substrate container according to one embodiment of the present disclosure.

FIG. 8 is a flow chart illustrating a transfer-out process of a substrate container according to one embodiment of the present disclosure.

FIG. 10 is a flow chart illustrating a substrate treatment process according to one embodiment of the present disclosure.

DETAILED DESCRIPTION

Various embodiments of the present disclosure will now be described with reference to the drawings.

Figure 1:
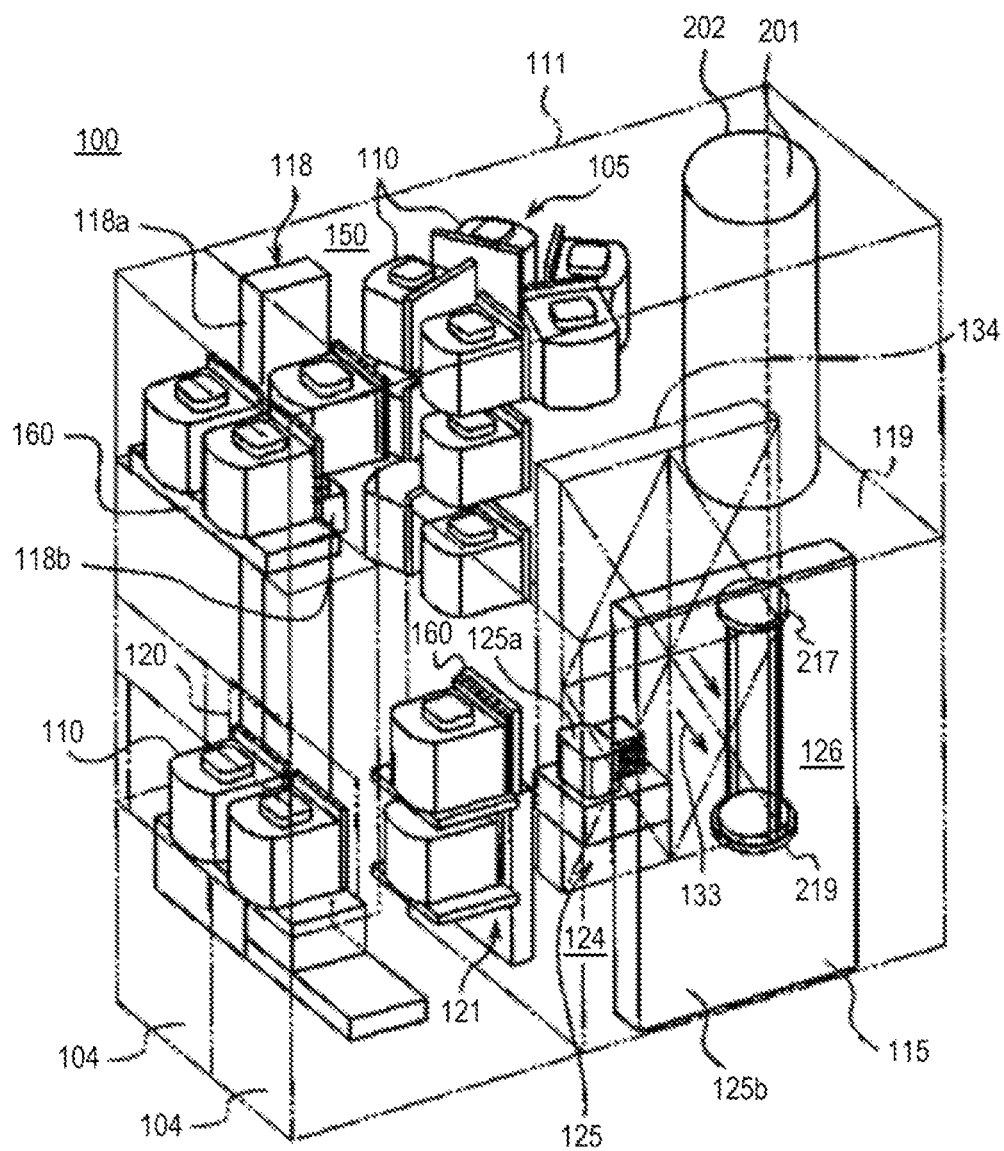
FIG. 1 illustrates an oblique perspective view of a substrate processing apparatus according to one embodiment of the present disclosure.
Figure 2:
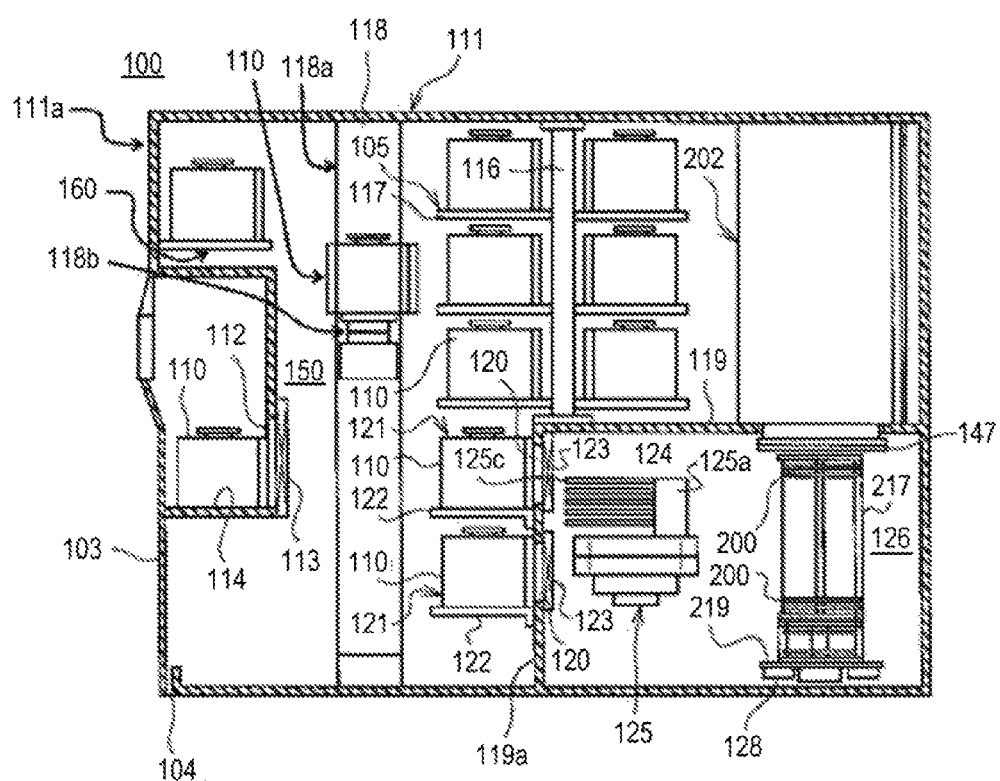
FIG. 2 illustrates a side perspective view of the substrate processing apparatus according to one embodiment of the present disclosure.

Configuration of Substrate Processing Apparatus According to a First Embodiment The configuration of a substrate processing apparatus 100 according to a first embodiment is described with reference to FIGS. 1 and 2. FIG. 1 illustrates an oblique perspective view of the substrate processing apparatus 100 according to the present embodiment. FIG. 2 illustrates a side perspective view of the substrate processing apparatus 100 according to the present embodiment. In the substrate processing apparatus 100 of the present embodiment, steps of forming a film on a substrate, modifying the film, and the like in a process of manufacturing a semiconductor device or a semiconductor element may be performed. As used herein, the semiconductor device refers to an integrated circuit such as the above-mentioned LSI, a microprocessor, a semiconductor memory, and the like. In addition, as used herein, the semiconductor element refers to a diode, a transistor, a thyristor, and the like.

As illustrated in FIGS. 1 and 2, the substrate processing apparatus 100 according to the present embodiment includes a housing 111 configured as a pressure-resistant container. A front maintenance entrance 103 is installed at a front side of a front wall 111a of the housing 111 as an opening for allowing maintenance. A front maintenance door 104 is installed at the front maintenance entrance 103 to open and close the front maintenance entrance 103.

In order to transfer a wafer 200 as a substrate into and out of the housing 111, a pod 110 is used as a wafer carrier (i.e., substrate container) configured to accommodate a plurality of wafers 200. An example of the wafer carrier may include a FOUP (Front Opening Unified Pod). A pod loading/unloading port (i.e., a substrate container loading/unloading port) 112 is formed at the front wall 111a of the housing 111 to communicate with the interior and the exterior of the housing 111. The pod loading/unloading port 112 is configured to be opened and closed by means of a front shutter (i.e., substrate container loading/unloading port opening/closing mechanism) 113. A load port (i.e., a substrate container transfer stand) 114 is installed in front of and at a lower side of the pod loading/unloading port 112. The pod 110 is configured to be transferred by a transfer device in the process and held on the load port 114 to be aligned thereon. The wafer 200 is made of silicon (Si) or the like. The formation of a natural oxide film may be problematic on a metal film, which is formed on the wafer 200 and serves as a metal wiring and an electrode constituting a semiconductor device. In addition, in some cases, a semiconductor device formed on the wafer 200 may be structured in a complicated manner. A substrate may have an increased surface area during manufacture of such a semiconductor device. For example, unevenness of a high aspect ratio is formed. The substrate having such a complicated structure and an increased surface area has a problem with local formation of a natural oxide film. A natural oxide film may be locally formed due to, for example, an increase in the surface area by wafer upsizing.

Various embodiments of the present disclosure are directed to techniques for reducing oxygen concentration, as will be described later, which are necessary for providing higher quality and high manufacture throughput of a semiconductor device while suppressing the formation of natural oxide films on the wafer 200.

(Substrate Container Transfer Chamber)

A substrate container transfer chamber 150 serving as a transfer space for the pod 110 is installed at the back side of the load port 114 within the housing 111.

(Substrate Container Transfer Device)

A pod transfer device (i.e., substrate container transfer device) 118 is installed in the vicinity of the load port 114 within the housing 111. A rotary pod shelf (i.e., substrate container mounting shelf) 105 is installed at a further inner side of the pod transfer device 118 within the housing 111 and at an upper side of an approximately central portion in the back-and-forth direction within the housing 111.

The pod transfer device 118 includes a pod elevator (i.e., substrate container elevating mechanism) 118a that can ascend and descend with the pod 110 hold therein, and a pod transfer mechanism (i.e., substrate container transfer mechanism) 118b as a transfer mechanism. The pod transfer device 118 is configured to transfer the pod 110 between the load port 114, the rotary pod shelf 105, and pod openers 121, which will be described later, by consecutive operations of the pod elevator 118a and the pod transfer mechanism 118b.

(First Purging Part)

Figure 4:
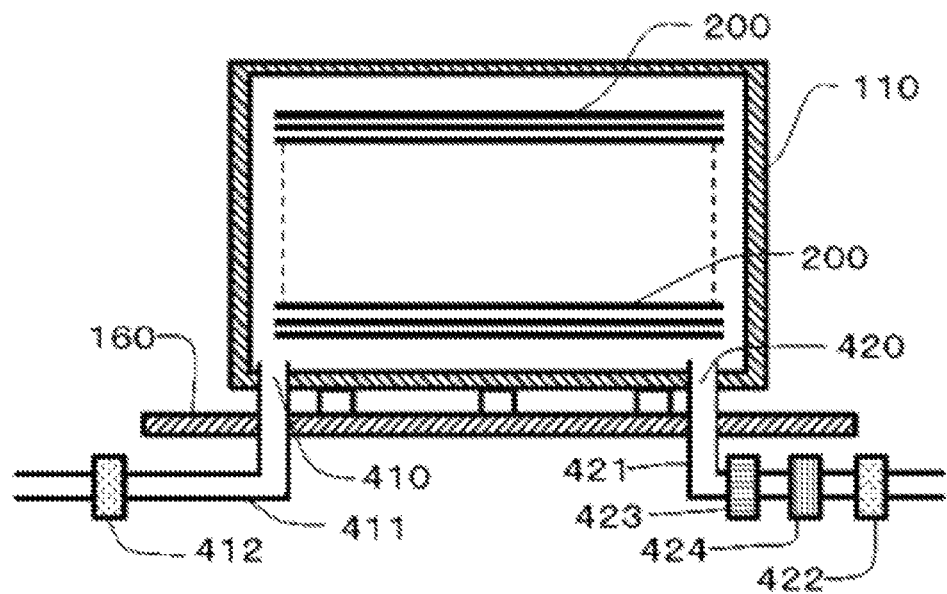
FIG. 4 shows a configuration of a main mounting part according to one embodiment of the present disclosure.

A main substitution shelf 160 as a first purging part (e.g., main mounting part) for purging the internal atmosphere of the pod 110 and limiting an oxygen concentration within the pod 110 to a predetermined control value or less is installed in the vicinity of the load port 114 (for example, in an upper side of the load port 114) within the housing 111. As used herein, purging refers to reducing the oxygen concentration within the pod 110, as will be described later. A main purging port as shown in FIG. 4 is installed to the main substitution shelf 160. A main gas supplying hole 410 and a main gas exhaust hole 420 are installed to the main purging port. A gas supplying pipe 411 is connected to the main gas supplying hole 410. The gas supplying pipe 411 is equipped with a main flow rate control device 412 configured such that its flow rate is controlled by a controller 280 which will be described below. The main flow rate control device 412 is configured to include one or both of a valve (not shown) and a mass flow controller (not shown). A gas exhaust pipe 421 is connected to the main gas exhaust hole 420. In addition, a main exhaust valve 422 configured to regulate an amount of gas exhaust may be installed to the gas exhaust pipe 421. Further, an oxygen concentration meter 423 to detect oxygen concentration within the pod 110 or the exhaust gas from the pod 110 may be installed to the gas exhaust pipe 421. In addition, a dew point meter 424 to detect humidity within the pod 110 or the exhaust gas from the pod 110 may be installed to the gas exhaust pipe 421.

(Second Purging Part)

Figure 5:
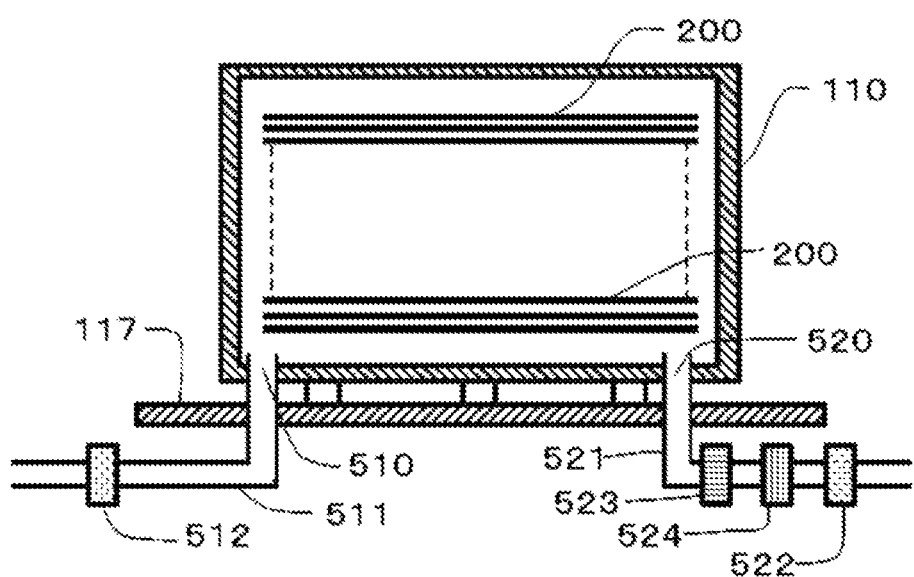
FIG. 5 shows a configuration of a sub-mounting part according to one embodiment of the present disclosure.

The sub-substitution shelf (i.e., pod shelf) 105 as a second purging part is installed in the back side of the substrate container transfer chamber 150 within the housing 111. A plurality of shelf planks 117 (i.e., substrate container mounting stands) configured to store a plurality of pods 110 is installed to the pod shelf 105. In addition, each of the plurality of shelf planks 117 is provided with a sub-purging port for limiting the oxygen concentration within the pod 110 to a predetermined control value or less by purging (e.g., gas-substituting) the interior of the pod 110. In addition, the pod shelf 105 may be configured to rotate. The rotary pod shelf 105 is provided with a support rod 116 that vertically stands and intermittently rotates in the horizontal plane, in addition to the plurality of shelf planks 117. As shown in FIG. 5, a sub-gas supplying hole 510 and a sub-gas exhaust hole 520 are installed to the sub-purging port. A gas supplying pipe 511 is connected to the sub-gas supplying hole 510. The gas supplying pipe 511 is equipped with a sub-flow rate control device 512 configured such that its flow rate is controlled by the controller 280, which will be described below. The sub-flow rate control device 512 is configured to include one or both of a valve (not shown) and a mass flow controller (not shown). A gas exhaust pipe 521 is connected to the sub-gas exhaust hole 520. In addition, a sub-exhaust valve 522 configured to regulate an amount of gas exhaust may be installed to the gas exhaust pipe 521. Further, an oxygen concentration meter 523 to detect oxygen concentration within the pod 110 or the exhaust gas may be installed to the gas exhaust pipe 521. In addition, a dew point meter 524 to detect humidity within the pod 110 or the exhaust gas may be installed to the gas exhaust pipe 521. The first purging part and the second purging part constitute a purging apparatus suitable for the substrate processing apparatus 100.

(Predetermined Control Value)

A first control value and a second control value are set as predetermined control values of the oxygen concentration. Data of the first and the second control values may be configured to be changed depending on a result of calculation by a CPU 280a which will be described below. In addition, the first and the second control values may be configured to be set with data input from an input device 281. Specifically, the first control value may be set to be lower than the second control value. More specifically, the first control value may be 600 ppm and the second control value may be equal to or more than 600 ppm and equal to or less than 1000 ppm. The main mounting part is purged to lower the oxygen concentration to the first control value or less, while the sub-mounting part is purged to lower the oxygen concentration to the second control value or less (hereinafter, purging to the first control value or less is referred to as a first purge and purging to the second control value or less is referred to as a second purge).

When the first purge is performed, a first flow rate of inert gas is fed from the main purging port into the pod 110. When the second purge is performed, a second flow rate of inert gas is fed from the sub-purging port into the pod 110. In this case, the first flow rate may be within a range of 20 slm to 100 slm, for example, 50 slm, and the second flow rate may be within a range of 0.5 slm to 20 slm, for example, 5 slm.

(Method of Adjusting Oxygen Concentration in Pod)

For adjustment of the oxygen concentration in the pod 110, the above-mentioned oxygen concentration meters 423 and 523 may be used to detect the oxygen concentration within the pod 110 or the exhaust gas and perform a feedback control based on the detected oxygen concentration. Alternatively, a relationship between the amount and the time of the inert gas supply and the oxygen concentration within the pod 110 may be obtained in advance and the amount and the time of the inter gas supply may be set based on the relationship for adjustment of the oxygen concentration.

At the bottom of the housing 111 a sub-housing 119 is installed from an approximately central portion to a rear end portion in the back-and-forth direction within the housing 111. In a front wall 119a of the sub-housing 119, a pair of wafer loading/unloading ports (i.e., substrate loading/unloading ports) 120 for transferring the wafer 200 into and out of the sub-housing 119 are installed to be arranged as two upper and lower stages in the vertical direction. The pod openers (i.e., substrate airier opening/closing units) 121 are installed to the upper and lower wafer loading/unloading ports 120, respectively.

Each pod opener 121 includes a pair of mounting table 122 for mounting the pod 110, and a cap attaching/detaching mechanism (i.e., cover attaching/detaching mechanism) 123 for attaching and detaching a cap (e.g., cover) of the pod 110. The pod opener 121 is configured to open and close a wafer discharge opening of the pod 110 by attaching and detaching the cap of the pod 110 mounted on the mounting table 122 by means of the cap attaching/detaching mechanism 123.

Within the sub-housing 119 is provided a transfer chamber 124 as a substrate transfer chamber hermetically isolated from the space where the rotary pod shelf 105, the pod transfer device 118 and so on are installed. A wafer transfer mechanism (i.e., substrate transfer mechanism) 125 is installed in the front region of the transfer chamber 124. The wafer transfer mechanism 125 includes a wafer transfer device (i.e., substrate transfer device) 125a capable of rotating or linearly moving the wafer 200 in the horizontal direction, and a wafer transfer device elevator (i.e., substrate transfer device elevating mechanism) 125b for lifting and lowering the wafer transfer device 125a (see FIG. 1). The wafer transfer device elevator 125b is interposed between the right end portion in the front region of the transfer chamber 124 of the sub-housing 119 and the right end portion of the housing 111 (see FIG. 1). The wafer transfer device 125a includes tweezers (i.e., substrate holder) 125c as a mounting part of the wafer 200. The wafer 200 can be loaded (charged) onto and unloaded (discharged) from a boat (i.e., substrate holding tool) 217 by consecutive operations of the wafer transfer device 125a and the wafer transfer device elevator 125b.

A wait unit 126 for accommodating the boat 217 in a wait status is installed in the rear region of the transfer chamber 124. Above the wait unit 126 is located a processing vessel 202 for processing the wafer 200. The bottom of the processing vessel 202 is configured to be opened and closed by a furnace shutter (i.e., furnace opening/closing mechanism) 147. The configuration of the processing vessel 202 will be described below.

A boat elevator (i.e., substrate holding tool elevating mechanism) 115 for elevating and lowering the boat 217 is interposed between the right end portion of wait unit 126 in the sub-housing 119 and the right end portion of the housing 111 (see FIG. 1). An arm 128 serving as a connection member is connected to an elevating stand of the boat elevator 115. A seal cap 219 serving as a furnace cover is horizontally installed in the arm 128. The seal cap 219 is configured to support the boat 217 vertically and block the bottom of the processing vessel 202.

The boat 217 is configured to hold a plurality of (for example, 50 to 125 or so) wafers 200 vertically with the centers of the wafers 200 aligned vertically.

As shown in FIG. 1, a clean air unit 134 including a supply fan and a dust-proof filter for supplying a clean atmosphere or clean air as inert gas is installed in the left end portion of the transfer chamber 124 which is in the opposite side to the wafer transfer device elevator 125b and the boat elevator 115. The clean air 133 flowed from the clean air unit 134 is distributed around a notch aligner, the wafer transfer device 125a, and the boat 217 in the wait unit 126, and then drained by a duct to be exhausted out of the housing 111 or circulated up to a primary side (also may be referred to as a supplying side) which is an absorption side of the clean air unit 134 to flow back into the transfer chamber 124 by the clean air unit 134.

(Configuration of Processing Furnace)

Figure 3:
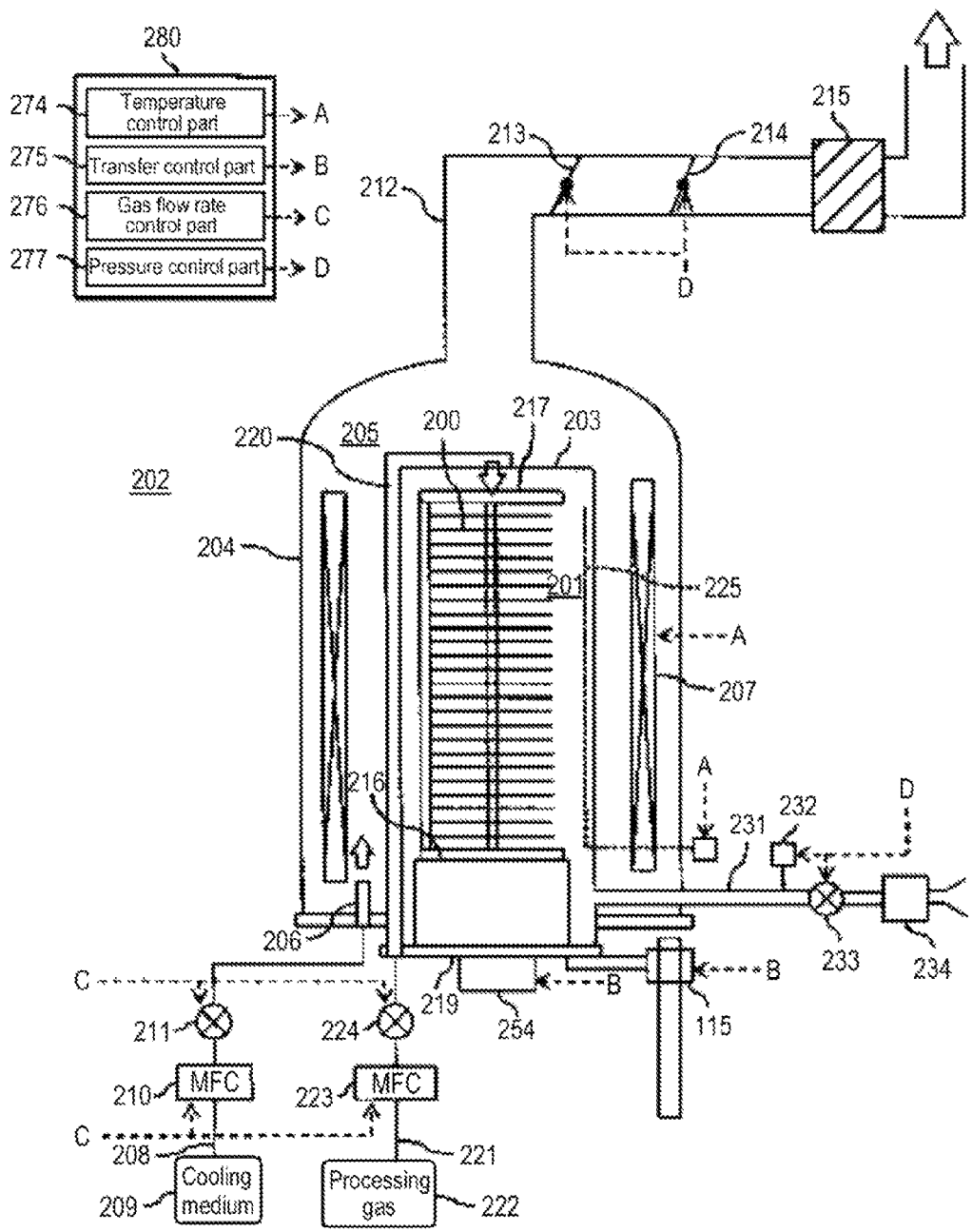
FIG. 3 depicts a vertical sectional view of a processing furnace in the substrate processing apparatus according to one embodiment of the present disclosure.

A configuration of the processing vessel 202 according to the present embodiment is described with reference to FIG. 3 illustrating a vertical sectional view of the processing vessel 202 in the substrate processing apparatus 100.

(Processing Furnace)

As shown in FIG. 3, the processing vessel 202 includes a reaction tube 203 which is made of heat-resistant material such as, for example, quartz ($SiO_2$) or silicon carbide (SiC), and has a cylindrical shape with its upper and lower ends opened. A processing chamber 201 for processing the wafer 200 as a substrate is formed in a cylindrical hollow portion of the reaction tube 203. The processing chamber 201 is configured to accommodate the boat 217 that holds the wafer 200.

The boat 217 as the substrate holding tool is configured to hold a plurality of wafers 200 in a multi-stage with the centers of the wafers 200 aligned vertically. The boat 217 is made of a heat-resistant material such as, for example, quartz, silicon carbide, or a combination thereof. Below the boat 217 is installed a heat insulator 216 that is made of a heat-resistant material such as, for example, quartz, silicon carbide, or a combination thereof, and is configured to suppress a heat transfer from a heater 207 (which will be described later) to the seal cap 219.

Below the reaction tube 203 is installed the seal cap 219 as a furnace cover capable of hermetically blocking the bottom opening of the reaction tube 203. The seal cap 219 is in contact with the lower end of the reaction tube 203 from its bottom side in the vertical direction. The seal cap 219 is made of metal such as, for example, stainless steel, and is formed as a disc shape. An O-ring as a seal member contacting the lower end of the reaction tube 203 is installed on the top side of the seal cap 219. As described above, the seal cap 219 is configured to be vertically lifted and lowered by the boat elevator 115 as an elevating mechanism which is vertically installed outside the reaction tube 203. When the seal cap 219 is lifted and lowered, the boat 217 can be transferred into and out of the processing chamber 201.

A rotating mechanism 254 for rotating the boat 217 is installed around the center of the seal cap 219 in the opposite side to the processing chamber 201. A shaft of the rotating mechanism penetrates through the seal cap 219 and supports the boat 217 from its bottom side. The rotating mechanism 254 is configured to rotate the wafer 200 by rotating the boat 217.

A transfer control part 275 is electrically connected to the rotating mechanism 254 and the boat elevator 115. The transfer control part 275 is configured to control the rotating mechanism 254 and the boat elevator 115 so that they can perform intended operations at intended timings. In addition, the transfer control part 275 is also electrically connected to the above-mentioned pod elevator 118a, pod transfer mechanism 118b, pod opener 121, wafer transfer device 125a, wafer transfer device elevator 125b and so on, and is configured to control these components to perform intended operations at intended timings. A transfer system according to the present embodiment mainly includes the boat elevator 115, the rotating mechanism 253, the pod elevator 118a, the pod transfer mechanism 118b, the pod opener 121, the wafer transfer device 125a, and the wafer transfer device elevator 125b.

The heater 207 as a heating part for heating the wafer 200 in the reaction tube 203 is installed at the outside of the reaction tube 203 to surround a side wall of the reaction tube 203. The heater 207 has a cylindrical shape and is vertically mounted by being supported by a heater base as a holding plate.

A temperature sensor 225 such as, for example, a thermocouple or the like is installed as a temperature detector within the reaction tube 203. A temperature control part 274 is electrically connected to the heater 207 and the temperature sensor 225. The temperature control part 272 is configured to adjust power supplied into the heater 207, based on temperature information detected by the temperature sensor 225, so that the internal temperature of the processing chamber 201 can have an intended temperature distribution at an intended timing.

A processing gas supplying nozzle 220 is interposed between the reaction tube 203 and the heater 207. The upper end (i.e., the downstream end) of the processing gas supplying nozzle 220 is hermetically installed on the top of the reaction tube 203 (e.g., an opening formed in the upper end of the reaction tube 203). The processing gas supplying nozzle 220 located in the upper end opening of the reaction tube 203 has a plurality of processing gas supplying holes formed therein.

A downstream end of a processing gas supplying pipe 221 for supplying processing gas is connected to the upstream end of the processing gas supplying nozzle 220. A processing gas supplying source 222, a mass flow controller (MFC) 223 as a flow rate controller, and a valve 224 as an opening/closing valve are installed to the processing gas supplying pipe 221 in this order from the upstream side.

A gas flow rate control part 276 is electrically connected to the MFC 223. The gas flow rate control part 276 is configured to control the MFC 223 so that the gas supplied into the processing chamber 201 can have an intended flow rate at an intended timing.

A processing gas supplying system mainly includes the processing gas supplying pipe 221, the MFC 223, and the valve 224. The processing gas supplying system may also include the processing gas supplying nozzle 220 and the processing gas supplying source 222.

The upstream end of an exhaust pipe 231 for exhausting the internal atmosphere of the reaction tube 203 (or the processing chamber 201) is connected to the reaction tube 203. A pressure sensor 232 as a pressure detector (e.g., pressure detecting part) for detecting the internal pressure of the processing chamber 201, an APC (Auto Pressure Controller) valve 233 as a pressure regulator, and a vacuum pump 234 as a vacuum exhauster are installed to the exhaust pipe 231 in this order from the upstream side. In addition, the APC valve 233 is an opening/closing valve which is capable of starting and stopping vacuum-exhaust of the interior of the reaction tube 203 by opening and closing the valve and also is capable of regulating the internal pressure of the reaction tube 203 by regulating a degree of valve opening.

A pressure control part 277 is electrically connected to the APC valve 233 and the pressure sensor 232. The pressure control part 277 is configured to control the APC valve 233 based on a pressure value detected by the pressure sensor 232 so that the processing chamber 201 can have an intended internal pressure at an intended timing.

A processing gas exhaust part mainly includes the exhaust pipe 231, the pressure sensor 232, and the APC valve 233. The processing gas exhaust part may also include the vacuum pump 234.

(Control Part)

As shown in FIG. 6, the controller 280 as a control part (i.e., control means) is implemented with a computer including a CPU (Central Processing Unit) 280a, a RAM (Random Access Memory) 280b, a storage 280c, and an I/O port 280d. The RAM 280b, the storage 280c, and the I/O port 280d are configured to exchange data with the CPU 280a via an internal bus 280e. The controller 280 may be connected with an input device 281 such as, for example, a touch panel, a mouse, a keyboard, an operation terminal, or the like. In addition, the controller 280 may also be connected with a display part such as, for example, a display device or the like.

Examples of the storage 280c may include a flash memory, an HDD (Hard Disk Drive), a CD-ROM, or the like. The storage 280c stores, in a readable manner, control programs to control operations of the substrate processing apparatus 100, process recipes describing substrate treatment processes and conditions, and so on. The process recipes function as programs to cause the controller 280 to execute each procedure in substrate treatment processes, as will be described later, and obtain a desired result. Hereinafter, these process recipes and the control programs are collectively simply referred to as programs. As used herein, the term "programs" may be intended to include process recipes only, control programs only, or any combinations thereof. The RAM 280b is configured as a memory area (or work area) in which programs and data read by the CPU 280a are temporarily stored.

The I/O port 280d is connected to the above-mentioned mass flow controllers 210 and 223, the valves 211 and 224, the shutters 213 and 214, the APC valve 233, the heater 207, temperature sensor 225, the boat rotating mechanism 254, the main flow rate control device 412, the main exhaust valve 422, the sub-flow rate control device 512, the sub-exhaust valve 522, the vacuum pump 234, the pod openers 121, the load port 114, the pod transfer device 118, the wafer transfer mechanism 125, the clean air unit 134, and so on.

The CPU 280a is configured to read and execute a control program from the storage 280c and read a process recipe from the storage 280c in response to an input of an operation command via the input device 281. The CPU 280a is configured to control a temperature adjustment operation of the heater 207 based on the temperature sensor 225 through a signal line A, a rotation speed adjustment operation of the boat rotating mechanism 254 through a signal line B, a flow rate adjustment operation of various gases by the mass flow controllers 210 and 223 through a signal line C, an opening/closing operation of the valves 211 and 224, a shutting operation of the shutters 213 and 214, an opening regulating adjustment operation of the APC valve 233 through a signal line D, etc., in accordance with contents of the read process recipes.

The controller 280 may not be limited to being implemented with a dedicated computer but may be implemented with a general purpose computer. For example, the controller 280 according to the present embodiment may be configured by preparing an external storage 282 (for example, a magnetic tape, a magnetic disk such as a flexible disk or a hard disk, an optical disk such as a CD or a DVD, a magneto-optical disk such as a MO, or a non-volatile semiconductor memory such as a USB (Universal Serial Bus) memory, a USB flash drive, or a memory card) and installing a program on the general purpose computer using the external storage 282. A means for providing a program to the computer is not limited to the case where the program is provided via the external storage 282. For example, the program may be provided using a communication means such as the Internet or a dedicated line without using the external storage 282. The storage 280c and the external storage 282 are configured as a computer-readable recording medium which may be hereinafter abbreviated as a recording medium. The term "recording medium" used herein may include the storage 280c only, the external storage 282, or both of them.

(Operation and Transfer Process of Substrate Processing Apparatus)

An operation of the substrate processing apparatus 100, a process of substrate container transfer, and a process of substrate transfer according to the present embodiment will be now described with reference to FIGS. 1, 2 and 7 and other relevant figures. The process of substrate container transfer according to the present embodiment is illustrated in FIG. 7.

(Loading From Load Port (T110))

As shown in FIGS. 1 and 2, when the pod 110 is supplied to the load port 114, the pod loading/unloading port 112 is opened by the front shutter 113. Then, the pod 110 on the load port 114 is loaded from the pod loading/unloading port 112 into the housing 111 by the pod transfer device 118.

(Wafer Number Counting (T120))

The pod 110 transferred into the housing 111 is loaded by the pod transfer device 118 onto the mounting table 122 of the pod opener 121. While the wafer loading/unloading ports 120 of the pod openers 121 are blocked by the cap attaching/detaching mechanism 123, the clean air 133 is filled and circulated in the transfer chamber 124. When the transfer chamber 124 is filled with the clean air 133 such as, for example, inert gas, the oxygen concentration within the transfer chamber 124 is set to, for example, 20 ppm or less, which is lower than the oxygen concentration within the housing 111 corresponding to the air atmosphere.

The end surface at the opening side of the pod 110 held on the mounting table 122 is pressed against the peripheral portion of the opening of the wafer loading/unloading port 120 in the front wall 119a and the cap of the pod 110 is detached by the cap attaching/detaching mechanism 123 to open the wafer discharge opening. When the wafer discharge opening is opened, the interiors of the pod 110 and the pod opener 121 are purged with an inert gas. In this case, the interiors are purged so that the oxygen concentration within the pod 110 may be set, specifically, to the first control value, more specifically, 20 ppm or less. Thereafter, a wafer number counter (not shown) counts the number of wafers 200 in the pod 110 and checks the status of the wafers 200. Once the number of wafers 200 is counted, the cap is attached by the cap attaching/detaching mechanism 123.

(Second Purge (T130))

Once the number of wafers 200 within the pod 110 is counted by the pod opener 121, the pod 110 is transferred to and held on the pod shelf 105. The pod 110 held on the pod shelf 105 is second-purged by the sub-purging port so that the oxygen concentration within the pod 110 is set to the second control value or less. The second purge may be performed continuously or intermittently at any time while the pod 110 is held on the pod shelf 105. The process of transferring the pod 110 from the load port 114 to the pod shelf 105 may be repeated the number of times that the pod shelf 105 can hold the pods 110.

(First Purge (Pre-Purge) (T140))

Among the plurality of pods 110 held on the pod shelves 105, the pod 110, to which a film formation is to be performed, is transferred from the pod shelf 105 to the main substitution shelf 160. The pod 110 transferred to the main substitution shelf 160 is held on the main substitution shelf 160. The pod 110 held on the main substitution shelf 60 is first-purged (pre-purged) by the main purging port installed to the main substitution shelf 160.

(Wafer Loading Onto Boat (T150))

The first-purged pod 110 on the main substitution shelf 160 is transferred from the main substitution shelf 160 onto the mounting table 122 of the pod opener 121. The end surface of the opening side of the pod 110 held on the mounting table 122 is pressed against the periphery portion of the opening of the wafer loading/unloading port 120 in the front wall 119*a* of the sub-housing 119 and the cap of the pod 110 is detached by the cap attaching/detaching mechanism 123 to open the wafer discharge opening. In this case, the wafer discharge opening is opened without performing the purging as in T120. When the pod 110 is opened, a wafer is picked up from the pod 110 by the tweezers 125*c* of the wafer transfer device 125*a*, aligned in the circumferential direction by the notch aligner, transferred into the wait unit 126 installed in the rear side of the transfer chamber 124, and then loaded (i.e., charged) into the boat 217. The wafer transfer device 125*a* that has loaded the wafer 200 into the boat 217 returns to the pod 110 to load a next wafer 200 into the boat 217.

While the wafer transfer mechanism 125 loads the wafer 200 from one of the pod openers 121 (e.g., upper or lower one) onto the boat 217, the pod transfer device 118 may transfer another pod 110, which has been held on the rotary pod shelf 105, onto the mounting table 122 of the other pod opener 121 (e.g., lower or upper one) and the pod opener 121 performs the opening operation of the pod 110 concurrently with the above loading operation of the wafers 200. The empty pod 110 is transferred from the pod opener 121 and held onto the pod shelf 105. The above-described second purge may be performed for the empty pod 110 held on the pod shelf 105. In this manner, the wafer loading (T150) onto the boat is performed.

When the prescribed number of wafers 200 is loaded into the boat 217, the bottom of the processing vessel 202, which has been blocked by the furnace shutter 147, is opened. Subsequently, as the boat elevator 115 lifts the seal cap 219, the boat 217 holding the wafers 200 is loaded into the processing vessel 202 (i.e., boat loading).

After the boat loading, the wafers 200 are subjected to any substrate processing in the processing vessel 202 which will be described below. The boat 217 with the processed wafers 200 is unloaded from the processing chamber 201 (i.e., boat unloading). After the boat unloading, a substrate unloading process is performed in a flow as shown in FIG. 8 without the process by the notch aligner to position the wafers 200.

(Substrate Unloading Process)

A substrate unloading process is described with reference to FIG. 8.

(Transfer of Empty Pod (T210))

After the boat unloading, the empty pod 110 is transferred from the pod shelf 105 to the pod opener 121.

(Wafer Accommodation into Empty Pod (T220))

When the pod 110 is held on the pod opener 121, the processed wafers 200 are accommodated in the pod 110 in the reverse order to the process of loading the wafers 200 onto the boat 217 (T150). The pod 110 in which the accommodation is completed is transferred back to the pod shelf 105. The operations of accommodating the wafers 200 in the pod 110 and back-transferring the pod 110 to the pod shelf 105 is repeated until all of the processed wafers 200 in the boat 217 are accommodated. For example, if one hundred wafers 200 are loaded in the boat 217 and the pod 110 can accommodate twenty wafers 200, the operation of the back-transfer is repeated five times. In this process, when the processed wafers 200 are accommodated in the pod 110, the first purge may be performed with the pod opener 121.

(Unloading from Load Port (T230))

After the pod 110 accommodating the processed wafers 200 is transferred back to the pod shelf 105 a predetermined number of times, the pod 110 is transferred from the pod shelf 105 to the load port 114. The pod 110 which has been transferred to the load port 114 is unloaded from the load port 114 out of the housing 111. The process of unloading the pod 110 from the pod shelf 105 out of the housing 111 via the load port 114 is repeated by the predetermined number of times as described above.

In this manner, the transfer of the pod 110 and the substrate is performed. The operations from transferring the empty pod (T210) to unloading from the load port (T230) may be repeated until all or some of pods stored in the pod shelf 105 are unloaded. In addition, after the processed wafers 200 are accommodated in the empty pod 110, the pod 110 may be transferred to the load port 114 to be unloaded out of the housing 111, without being transferred back to the pod shelf 105.

Figure 9A:
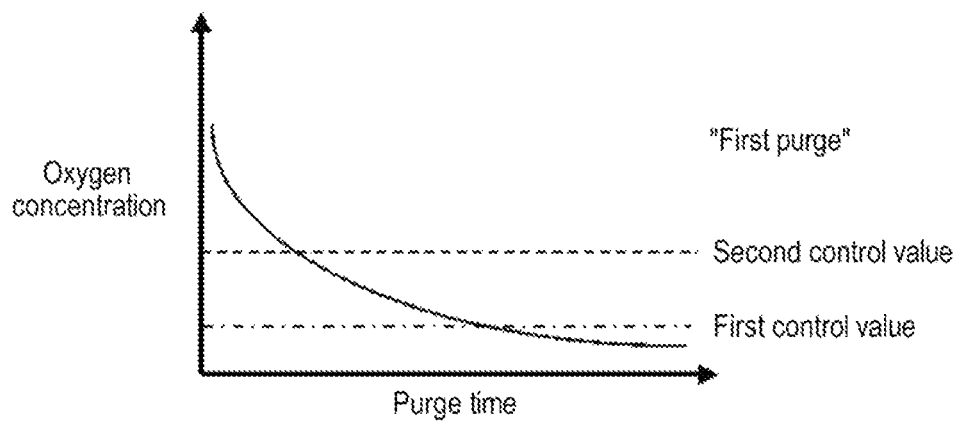
FIG. 9A shows a graphical representation of change in oxygen concentration in a substrate container during a first purge according to one embodiment of the present disclosure.
Figure 9B:
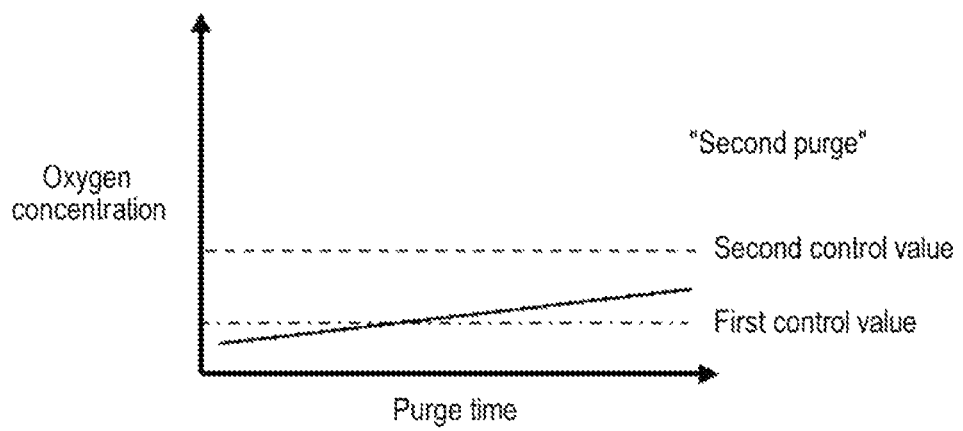
FIG. 9B shows a graphical representation of change in oxygen concentration in a substrate container during a second purge according to one embodiment of the present disclosure.

Control of the oxygen concentration within the pod 110 is described with reference to FIGS. 9A and 9B. FIG. 9A shows an example, by graph, of a change in the oxygen concentration in the pod during the first purge and FIG. 9B shows an example, by graph, of a change in the oxygen concentration in the pod during the second purge. As shown in FIG. 9A, in the first purge, purging is performed so that the oxygen concentration within the pod 110 can be changed from a value higher than the first control value to the first control value or less. As shown in FIG. 9B, in the second purge, purging is performed so that the oxygen concentration within the pod 110 can be set to the second control value or less that is higher than the first control value.

(Substrate Treatment Process)

A substrate treatment process as one of processes of manufacturing a semiconductor device is described according to the first embodiment with reference to FIG. 10. Related substrate treatment processes are performed by the above-described substrate processing apparatus 100. Here, as one example, a film formation process of forming a film on the wafer 200 using a CVD (Chemical Vapor Deposition) will be described. In the following description, operations of various parts constituting the substrate processing apparatus 100 are controlled by the controller 280.

(Substrate Loading Process (S10))

A plurality of wafers 200 is first loaded into the boat 217 (i.e., wafer charge) and the boat 217 holding the plurality of wafers 200 is lifted up and loaded into the reaction tube 203 (or the processing chamber 201) by the boat elevator 115 (boat loading). In this status, a furnace port which corresponds to the lower end opening of the reaction tube 203 is sealed by the seal cap 219.

(Pressure and Temperature Adjustment Process (S20))

The interior of the processing chamber 201 is vacuum-exhausted by the vacuum pump 234 so that it has an intended pressure (e.g., degree of vacuum). The internal pressure of the reaction tube 203 is measured by the pressure sensor 232 and a degree of valve opening of the APC valve 233 is feedback-controlled based on the measured pressure value (i.e., pressure adjustment). In addition, the interior of the processing chamber 201 is heated by the heater 207 so that it has an intended temperature (for example, 500° C. to 1,200° C., or specifically, 1,000° C.). The supply power to the heater 207 is feedback-controlled based on the temperature value detected by the temperature sensor 225 (i.e., temperature adjustment).

While the interior of the processing chamber 201 is heated, the boat rotating mechanism 254 is actuated to start rotating the boat 217, ultimately, rotating the wafers 200. In this case, a rotation speed of the boat 217 is controlled by the controller 280. In addition, the rotation of the boat 217 by the boat rotating mechanism 254 continues at least until a subsequent film formation process (S30) is completed.

(Film Formation Process (S30))

When the interior of the processing chamber 201 reaches the intended pressure and the intended temperature, supply of processing gas from the processing gas supplying pipe 221 into the reaction tube 203 is started. That is, the valve 224 is opened to supply the processing gas from the processing gas supplying source 222 into the reaction tube 203 while controlling its flow rate with the MFC 223. When passing through the processing chamber 201, the processing gas contacts a surface of the wafer 200 and a film is formed on the surface of the wafer 200 by thermal CVD reaction. While supplying the processing gas into the reaction tube 203, an opening degree of the APC valve 233 is adjusted to exhaust the interior of the processing chamber 201 using the vacuum pump 234. As a preset period of processing time lapses, the valve 224 is closed to stop the supply of the processing gas into the reaction tube 203.

(Cooling Process (S40))

When the film formation process (S30) is completed, the power supply to the heater 207 is stopped to start a cooling process (S40). In the cooling process (S40), a cooling medium is supplied from a cooling medium supply source 209 to a cooling medium passage 208, and discharged from the cooling medium passage 208.

When the processing vessel 202 reaches a temperature (for example, 600° C. or less, specifically, 600° C.) at which the wafers 200 may be unloaded from the processing vessel 202 (or the processing chamber 201), the supply of the cooling medium into the cooling medium passage 208 is stopped to end the cooling process (S40).

(Atmospheric Pressure Returning Process (S50) and Substrate Unloading Process (S60))

When the cooling process (S40) is ended, the opening degree of the APC valve 233 is adjusted to return the internal pressure of the processing chamber 201 to the atmospheric pressure. Then, the boat 217 is unloaded from the processing chamber 201 in the reverse process to that described in the substrate loading process (i.e., boat unload). Then, the processed wafers 200 are discharged from the boat 217 (i.e., wafer discharge) and accommodated in the pod 110, which ends the substrate treatment process according to the present embodiment.

Advantages of the First Embodiment

The first embodiment provides at least one or more advantages as follows.

(a) According to the first embodiment, the gas system may be simplified by dividing the purging process within the pod into the main mounting part and the sub-mounting part, which can result in reduction of the cost of parts used.

(b) According to the first embodiment, by performing the pre-purge before the transfer to the pod opener, it is possible to save purge time required for the cap opening/closing in the pod opener and improve a transfer throughput.

(c) According to the first embodiment, oxygen concentration within the pod 110 may be kept at the predetermined control value so that oxygen adsorption onto a metal film exposed at the surface of the substrate accommodated in the pod and formation of a natural oxide film can be suppressed, resulting in improvement of production quality of semiconductor devices.

(d) According to the first embodiment, since purging with inert gas can set the oxygen concentration within the pod 110 to the first control value in the main mounting part and to the second control value in the sub-mounting part, the amount of the inert gas used can be reduced.

(e) According to the first embodiment, since the number of wafers and status of the wafers within the pod 110 can be checked immediately after the pod 110 is loaded into the housing 111, purging a pod which has an abnormal or defective wafer may be omitted, and thus, the amount of inert gas used for purging can be reduced.

(f) According to the first embodiment, by supplying inert gas into the pod 110 at the first flow rate (e.g., equal to or between 20 slm to 100 slm) in performing the first purge, it is possible to prevent particles from being produced in the pod 110 and keep the interior of the pod under a low oxygen concentration environment.

(g) According to the first embodiment, it is possible to keep the oxygen concentration within the pod 110 at the predetermined control value and suppress formation of a local natural oxide film on the wafer 200 even where the wafer 200 has a large diameter such as 450 mm, which results in improvement of a production quality of semiconductor devices.

(h) According to the first embodiment, it is possible to keep the oxygen concentration within the pod 110 at the predetermined control value and suppress formation of a local natural oxide film on the wafer 200 even where a trench of a high aspect ratio is formed on the wafer 200 and a surface area on the wafer 200 is increased, which results in improvement of production quality of semiconductor devices.

(i) According to the first embodiment, by performing the first purge so that the oxygen concentration can be set to the first control value or less, it is possible to prevent the oxygen concentration from being increased over the first control value or being set to the second control value or greater even where the oxygen concentration rises while the pod 110 is moved from the main mounting part to a different place, which can result in prevention of a natural oxide film from being formed on the wafer 200.

A Second Embodiment of the Present Disclosure

Although the first embodiment of the present disclosure is described above in detail, the present disclosure is not limited to the particular embodiment but may be modified in different ways without departing from the scope and spirit of the present disclosure.

Figure 11:
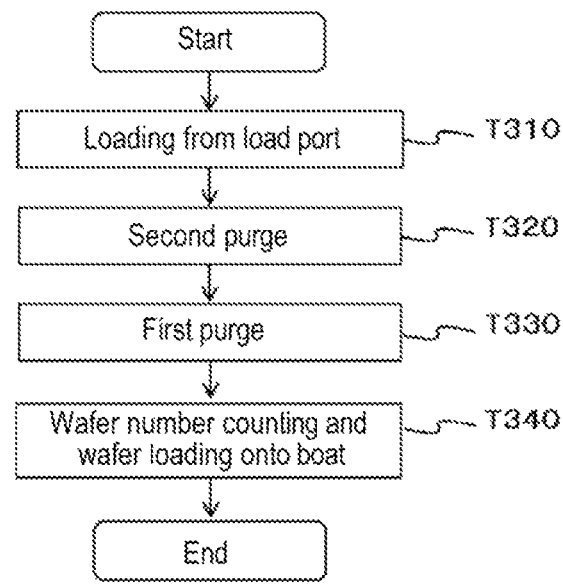
FIG. 11 is a flow chart illustrating a process of transferring a substrate container according to another embodiment of the present disclosure.

For example, the transfer process may be performed with a flow illustrated in FIG. 11 as a second embodiment. The transfer process in FIG. 11 will be described below.

(Loading From Load Port (T310))

When the pod 110 is held on the load port 114, the front shutter 113 opens the pod loading/unloading port 112. Then, the pod 110 on the load port 114 is transferred by the pod transfer device 118 from the pod loading/unloading port 112 into the housing 111.

(Second Purge (T320))

The pod 110 loaded from the load port 114 into the housing 111 is transferred by the pod transfer device 118 onto the pod shelf 105. This transfer is repeated only the number of times that the pod shelf 105 can hold the pods 110 or that is required for the substrate treatment process. The above-described second purge is performed in the pod 110 held on the pod shelf 105. The second purge may not be performed if the period of time during which the pod 110 is held on the pod shelf 105 is short.

(First Purge (T330))

The pod 110 held on the pod shelf 105 is transferred from the pod shelf 105 to be held on the main mounting shelf 160. The above-described first purge is performed in the pod 110 held on the main mounting shelf 160.

(Wafer Number Counting and Wafer Loading Onto Boat (T340))

The pod 110, which has been purged on the main mounting shelf 160 to lower the oxygen concentration within the pod 110 to the first control value or less, is transferred from the main mounting shelf 160 onto the pod opener 121 to be held on the mounting table 122 of the pod opener 121. The end surface of the opening side of the pod 110 held on the mounting table 122 is pressed against the periphery portion of the opening of the wafer loading/unloading port 120 in the front wall 119a of the sub-housing 119 and the cap of the pod 110 is detached by the cap attaching/detaching mechanism 123 to open the wafer discharge opening. At this time, the wafer discharge opening is opened without being purged as in T120. When the pod 110 is opened, the wafer number counter (not shown) counts the number of wafers 200 in the pod 110 and checks the status of the wafers 200. Once the number of wafers 200 is counted, the wafer 200 is loaded on the boat 217 as in the process of T150. When the loading process is completed, the boat loading is performed as described above. After the boat loading, the above-described substrate treatment process and substrate unloading process are performed.

Advantages of the Second Embodiment

The second embodiment described above provides one or more advantages as below, in addition to the above-described advantages with reference to the first embodiment.

(a) As compared with the first embodiment, the second embodiment can reduce wait time of the pod transfer device 118 and improve a transfer throughput by purging the pods in the main mounting shelf to be set to the first control value or less after all pods required for the process are held on the pod shelf, and then loading the wafers from the pod opener onto the boat.

(b) According to the second embodiment, by purging the interior of the pod 110 to the first control value or less and then performing the process of wafer number counting and wafer loading onto the boat in the pod opener 121 (T340), the number of purges of the pod 110 required for opening/closing of the cover of the pod 110 in the pod opener 121 can be reduced. In addition, since the purging in the pod opener 121 can be omitted, the substrate transfer time in the pod opener 121 can be shortened.

A Third Embodiment of the Present Disclosure

Although some embodiments of the present disclosure are described above in detail, the present disclosure is not limited to the embodiments but may be modified in different ways without departing from the scope and spirit of the present disclosure.

Figure 12:
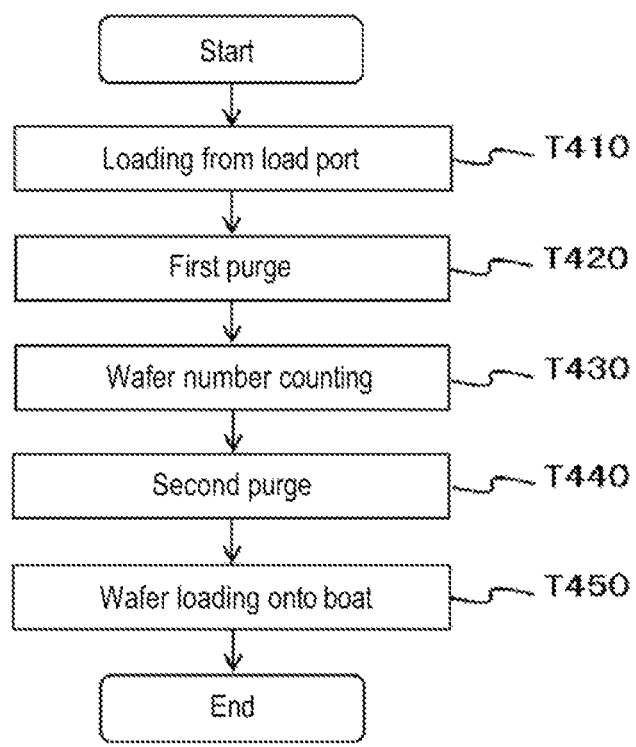
FIG. 12 is a flow chart illustrating a process of transferring a substrate container according to another embodiment of the present disclosure.

For example, the transfer process may be performed with a flow illustrated in FIG. 12, which illustrates a third embodiment. The transfer process in FIG. 12 will be described below.

(Loading From Load Port (T410))

Explanation of this process is omitted since it is performed as in T110.

(First Purge (T420))

The pod transfer device 118 transfers the pod 110, which has been loaded into the housing 111, to the main substitution shelf 160. The pod 110 transferred to the main substitution shelf 160 is first-purged as in T140.

(Wafer Number Counting (T430))

The pod 110, which has been purged in the main mounting shelf 160, is transferred from the main mounting shelf 160 onto the pod opener 121 to be held on the mounting table 122 of the pod opener 121. The end surface of the opening side of the pod 110 held on the mounting table 122 is pressed against the periphery portion of the opening of the wafer loading/unloading port 120 in the front wall 119a of the sub-housing 119 and the cap of the pod 110 is detached by the cap attaching/detaching mechanism 123 to open the wafer discharge opening. At this time, the wafer discharge opening is opened without being purged as in T120. When the pod 110 is opened, the wafer number counter (not shown) counts the number of wafers 200 in the pod 110 and checks the status of wafers 200.

(Second Purge (T440))

The pod 110 in which the number of wafers are counted and the wafer status is checked is transferred from the pod opener 121 to the pod shelf 105 and is second-purged in the pod shelf 105. The second purge may be performed continuously or intermittently while the pod 110 is being mounted.

(Wafer Loading Onto Boat (T450))

The pod 110 which has been held on the pod shelf 105 is again transferred to the pod opener 121 and the wafers in the pod 110 are loaded into the boat 217.

Advantages of the Third Embodiment

The third embodiment provides one or more advantages as below, in addition to one or more of the above-described advantages.

(a) According to the third embodiment, since the pod 110 is transferred to the pod opener 121 after the interior of the pod 110 is purged to be set to the first control value or less in the main substitution shelf 160, purging required for cap opening in the pod opener 121 can be omitted and a transfer throughput can be improved.

(b) According to the third embodiment, purging time in the transfer of the pod from the pod shelf 105 to the boat 217 can be shortened. In addition, since the time for counting the number of wafers is not required, time taken for the substrate transfer from the pod shelf 105 to the boat 217 can be shortened.

(c) According to the third embodiment, since the pod 110 having high oxygen concentration is transferred from the load port 114 to the main substitution shelf 160 and subjected to the first purging process even where the pod 110 is loaded from the load port 114 into the housing 111, the period of time under the condition of high oxygen concentration can be reduced and formation of a natural oxide film can be suppressed.

A Fourth Embodiment of the Present Disclosure

Although some embodiments of the present disclosure are described above in detail, the present disclosure is not limited to the embodiments but may be modified in different ways without departing from the scope and spirit of the present disclosure.

Figure 13:
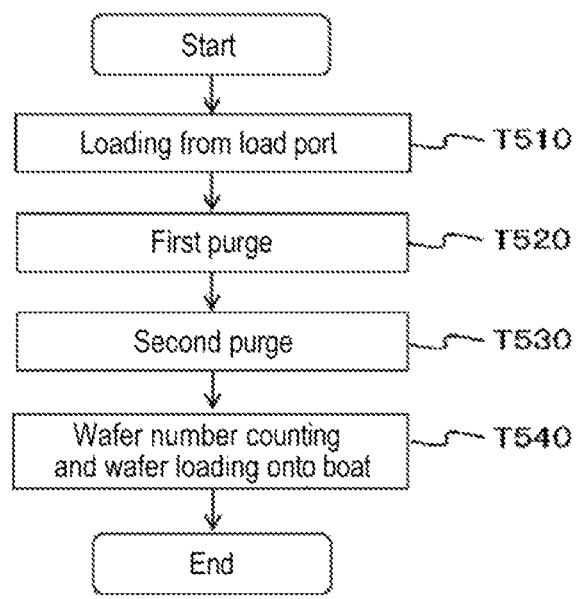
FIG. 13 is a flow chart illustrating a process of transferring a substrate container according to another embodiment of the present disclosure.

For example, the transfer process may be performed with a flow illustrated according to a fourth embodiment in FIG. 13. The transfer process in FIG. 13 will be described below.

(Loading From Load Port (T510))

Explanation of this process is omitted since it is performed as in T110.

(First Purge (T520))

Explanation of this process is omitted since it is performed as in T420.

(Second Purge (T530))

The pod 110, which has been purged in the main substitution shelf 160 so that the oxygen concentration can be set to the first control value or less, is transferred from the main substitution shelf 160 to the pod shelf 105. The pod 110 held on the pod shelf 105 is second-purged. The second purge may be performed continuously or intermittently while waiting.

(Wafer Number Counting and Wafer Loading Onto Boat (T540))

The pod 110, which has been waited in the pod shelf 105, is transferred to the pod opener 121. The wafers 200 are transferred from the pod 110 mounted on the pod opener 121 to the boat 217 and subjected to the above-described substrate processing.

Advantages of the Fourth Embodiment

The fourth embodiment also provides one or more of the above-described advantages.

A Fifth Embodiment of the Present Disclosure

Although some embodiments of the present disclosure are described above in detail, the present disclosure is not limited to the embodiments but may be modified in different ways without departing from the scope and spirit of the present disclosure.

Figure 14:
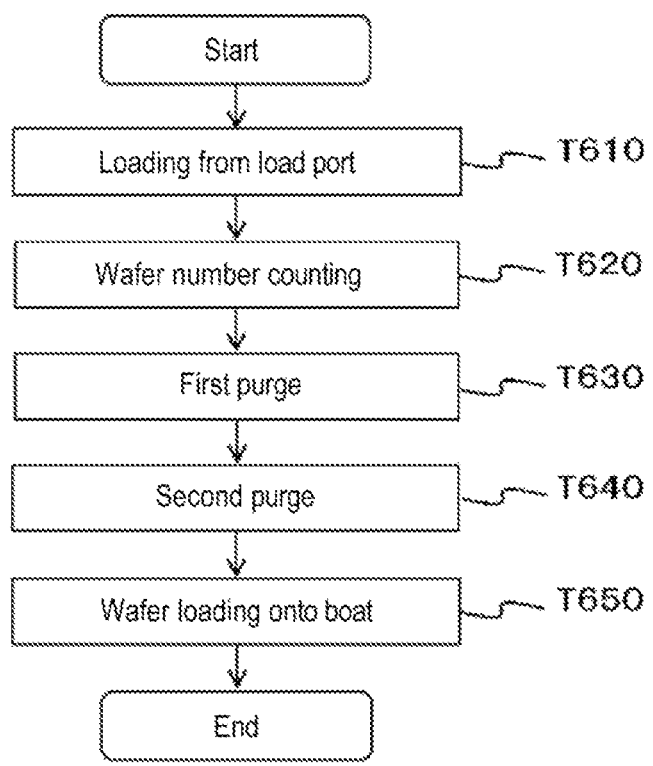
FIG. 14 is a flow chart illustrating a process of transferring a substrate container according to another embodiment of the present disclosure.

For example, the transfer process may be performed with a flow illustrated according to a fifth embodiment in FIG. 14. The transfer process in FIG. 14 will be described below.

(Loading From Load Port (T610))

Explanation of this process is omitted since it is performed as in T110.

(Wafer Number Counting (T620))

Explanation of this process is omitted since it is performed as in T120.

(First Purge (T630))

The pod 110, in which the number of wafers is counted and the status of the wafers is checked, is transferred to the main substitution shelf 160. The pod 110 transferred to the main substitution shelf 160 is first-purged.

(Second Purge (T640))

The pod 110, which has been purged to the first control value, is transferred from the main substitution shelf 160 to the pod shelf 105 and then second-purged. The second purge may be performed continuously or intermittently while the pod 110 is held.

(Wafer Loading Onto Boat (T650))

The pod 110, which has been waited in the pod shelf 105, is transferred back to the pod opener 121 and the wafers in the pod 110 are loaded into the boat 217.

Advantages of the Fifth Embodiment

The fifth embodiment also provides one or more of the above-described advantages.

A Sixth Embodiment of the Present Disclosure

Although some embodiments of the present disclosure are described above in detail, the present disclosure is not limited to the embodiments but may be modified in different ways without departing from the scope and spirit of the present disclosure.

Figure 15:
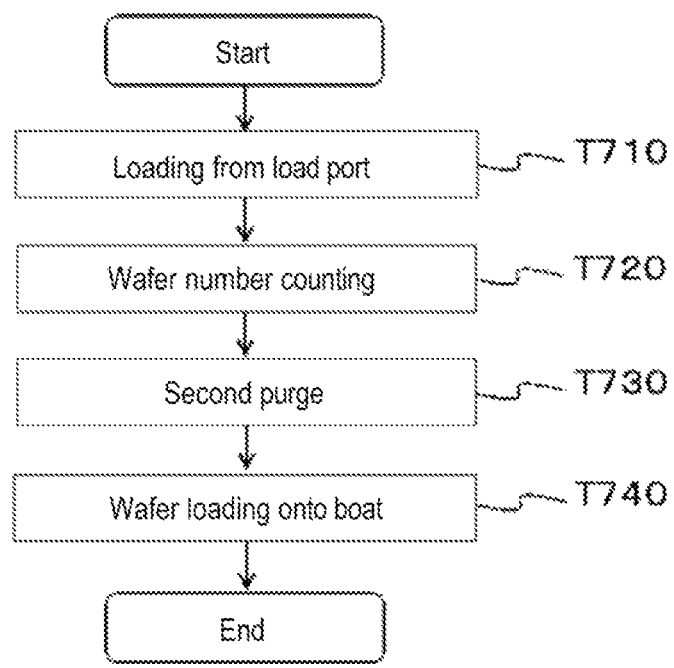
FIG. 15 is a flow chart illustrating a process of transferring a substrate container according to another embodiment of the present disclosure.

For example, the transfer process may be performed with a flow illustrated, according to a sixth embodiment, in FIG. 15 excluding the first purge process from FIG. 14. However, since the purging time in the pod opener 121 is longer than the purging time in the main substitution shelf 160, it may be preferable to perform the purging process in the main substitution shelf 160 such that the oxygen concentration within the pod is set to the first control value or less, as in the above-described embodiment Although it has been illustrated above in the present disclosure that only the oxygen concentration within the pod 110 is adjusted, humidity within the pod 110 may also be adjusted. Specifically, the purging process is performed such that the relative humidity within the pod 110 becomes 5%. For the humidity adjustment, the humidity within the pod 110 or the exhaust gas may be detected using the above-mentioned dew point meters 424 and 524 and a feedback control may be performed based on the detected humidity value. Alternatively, a relationship between the amount and the time of the inert gas supply and the humidity within the pod 110 may be obtained in advance and the amount and the time of the inert gas supply may be set based on the relationship for adjustment of the humidity.

In addition, although it has been illustrated above in the present disclosure that the main mounting part is used as the first purging part, without being limited thereto, the pod opener 121 or the load port 114 may be configured to have the same function and operate as in the first purging part. In addition, the main mounting part may be installed in multiple places.

In case where the pod opener 121 or the load port 114 acts as the first purging part, a pod mounting portion of the pod opener 121 or the load port 114 may have the same configuration as the main substitution shelf 160.

Figure 16:
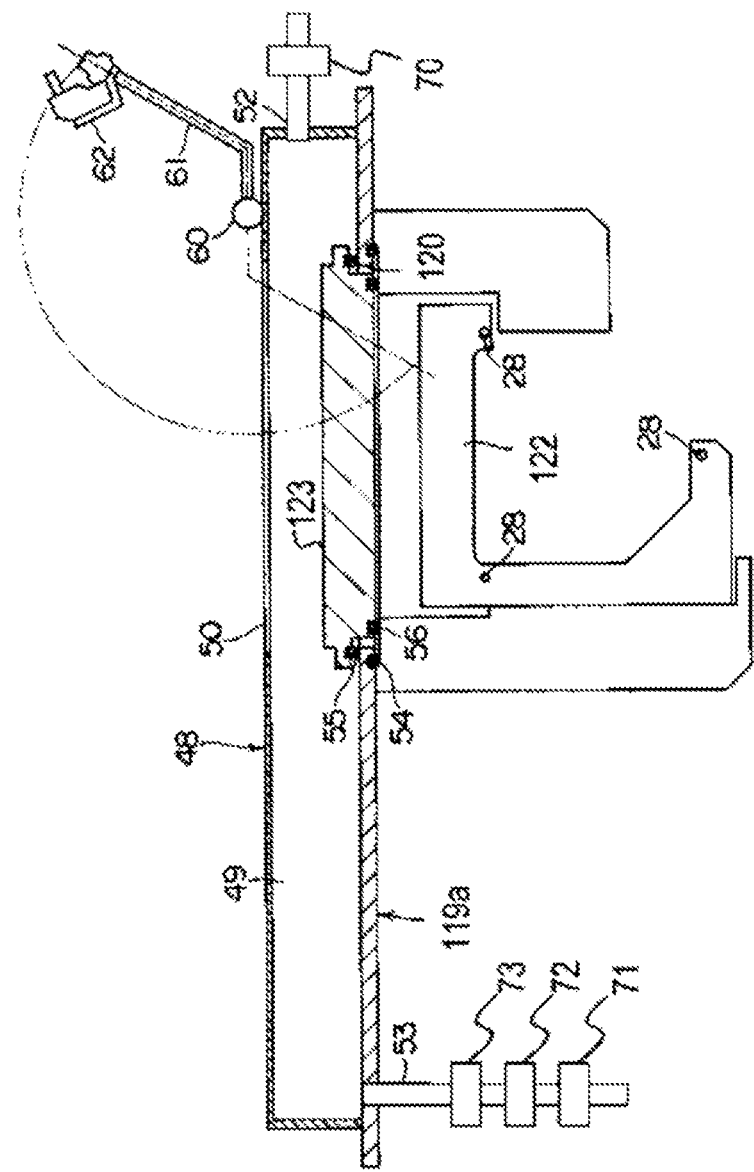
FIG. 16 is a plane sectional view of a pod opener according to another embodiment of the present disclosure.

In case where the pod opener 121 acts as the first purging part, it may be configured as follows. FIG. 16 is a plane sectional view of the pod opener 121. As shown in FIG. 16, positioning pins 28 are installed on the top side of the mounting table 122. The pod 110 is held at a predetermined position on the mounting table 122 by using the positioning pins 28. In addition, the pod opener 121 has a pod opener housing 48. The cap attaching/detaching mechanism 123 is accommodated in the interior (i.e., accommodation chamber 49) of the pod opener housing 48. The cap attaching/detaching mechanism 123 can close and open the wafer loading/unloading port 120. Reference numerals 54, 55, and 56 denote packing to ensure the air-tightness when the wafer loading/unloading port 120 is closed by the cap attaching/detaching mechanism 123.

A wafer discharge opening 50 is installed at a position opposing to the wafer loading/unloading port 120 in the pod opener housing 48. A gas supply pipe 52 for supplying nitrogen gas as inert gas into the accommodation chamber 49 is connected to a side wall of the pod opener housing 48. A gas exhaust pipe 53 is connected to the front wall 119a.

The gas supply pipe 52 is equipped with a flow rate control device 70 configured such that its flow rate is controlled by the controller 280, like the above-mentioned gas supplying pipe 411. The flow rate control device 70 is configured to include one or both of a valve and a mass flow controller. The gas exhaust pipe 53 may include an exhaust valve 71 configured to regulate an amount of gas exhaust. In addition, the gas exhaust pipe 53 may also include an oxygen concentration meter 72 to detect oxygen concentration within the pod 110 and the accommodation chamber 49 or oxygen concentration in the exhaust gas from the pod 110 and the accommodation chamber 49. In addition, the gas exhaust pipe 53 may be provided with a dew point meter 73 to detect humidity within the pod 110 and the accommodation chamber 49 or humidity in the exhaust gas from the pod 110 and the accommodation chamber 49.

A rotary actuator 60 is installed near the wafer discharge opening 50 of the pod opener housing 48. A wafer number counter device 62 is attached to the rotary actuator 60 via an arm 61.

When the pod 110 is held on the mounting table 122, the cap of the pod 110 is held by the cap attaching/detaching mechanism 123. In this case, the cap attaching/detaching mechanism 123 is in position to close the wafer loading/unloading port 120. When the cap attaching/detaching mechanism 123 is retracted with the cap held, the pod 110 and the wafer loading/unloading port 120 are opened while the wafer discharge opening 50 is closed.

With the wafer discharge opening 50 closed, inert gas is supplied from the gas supply pipe 52 into the accommodation chamber 49. Thus, air existing in the accommodation chamber 49 and the pod 110 is discharged from the gas exhaust pipe 53 and is substituted with the inert gas in the accommodation chamber 49 and the pod 110. In this case, a flow rate of the inert gas is set to a first flow rate (or more) so that the oxygen concentration within the pod 110 can be set to a first control value or less. For adjustment of the oxygen concentration in the accommodation chamber 49 and the pod 110 by the pod opener 121, the above-mentioned oxygen concentration meter 72 may be used to detect the oxygen concentration within the accommodation chamber 49 and the pod 110 or the oxygen concentration in the exhaust gas and perform a feedback control based on the detected oxygen concentration. Alternatively, a relationship between the amount and time of the inert gas supply and the oxygen concentration within the accommodation chamber 49 and the pod 110 may be obtained in advance and one or both of the amount and the time of the insert gas supply may be set based on the relationship for adjustment may of the oxygen concentration.

When the interiors of the accommodation chamber 49 and the pod 110 are purged, the cap attaching/detaching mechanism 123 moves forward and slides in a lateral direction. Thus, the wafer loading/unloading port 120 and the wafer discharge opening 50 are opened. When the rotary actuator 60 is driven to rotate the arm 61, the wafer number counter device 62 faces the pod 110 to count the number of wafers 200 accommodated in the pod 110. The wafer number counter device 62 may be installed in the wafer transfer mechanism 125. In this case, after the wafer loading/unloading port 120 and the wafer discharge opening 50 are opened, the wafer transfer mechanism 125 approaches to the pod 110 and the wafer number counter device 62 faces the pod 110 to count the number of wafers 200.

When the counting process for the number of wafers 200 is completed, the wafer number counter device 62 is returned to its original position. Then, when the cap attaching/detaching mechanism 123 slides in a lateral direction and then moves forward, the wafer loading/unloading port 120 is closed. Then, the cap of the pod 110 is attached to the pod 110 by means of the cap attaching/detaching mechanism 123.

In case where the pod opener 121 acts as the first purging part, for example, the first purge process (T420) and the wafer number counting process (T430) in the flow chart of FIG. 12 are consecutively performed in the pod opener 121. In case where the load port 114 acts as the first purging part, these processes are performed when the pod 110 is provided (e.g., mounted) on the load port 114. In this case, for example, in the flow chart of FIG. 12, the first purge (T420) is performed during the process of loading from the load port 114 (T410).

Although it has been illustrated above in the present disclosure that the first purge process and the second purge process are performed in different places, without being limited thereto, the first purge process and the second purge process may be sequentially performed in the same place.

The present disclosure can be applied a film forming process for forming various films such as an oxide film, a nitride film, a metal film and the like, using a CVD (Chemical Vapor Deposition) method, an ALD (Atomic Layer Deposition) method, a PVD (Physical Vapor Deposition) method or the like, and other substrate treatments such as plasma treatment, diffusion treatment, annealing, oxidation, nitridation, lithography and the like. In addition, the one or more embodiments of the present disclosure may be applied to a film forming apparatus and other substrate processing apparatuses such as an etching apparatus, an annealing apparatus, an oxidation apparatus, a nitridation apparatus, an exposure apparatus, a coating apparatus, a molding apparatus, a developing apparatus, a dicing apparatus, a wire bonding apparatus, a drying apparatus, a heating apparatus, an inspection apparatus and the like. Further, one or ore embodiments of the present disclosure is not limited to the vertical substrate processing apparatus 100 but may be applied to a horizontal substrate processing apparatus and a variety of processing apparatuses in a single wafer type.

Furthermore, the present disclosure is not limited to a semiconductor manufacturing apparatus fir processing semiconductor wafers, such as the substrate processing apparatus 100 according to the embodiments, but may be applied to other substrate processing apparatuses such as an LCD (Liquid Crystal Display) manufacturing apparatus, a solar cell manufacturing apparatus and the like.

Aspects of Present Disclosure

Hereinafter, some aspects of the present disclosure will be additionally described.
(Supplementary Note 1)

An aspect of the present disclosure provides a substrate processing apparatus including a processing vessel configured to process a substrate; a first purging part configured to perform a first purge to supply inert gas at a first flow rate into a substrate container accommodating the substrate; and a second purging part configured to perform a second purge to supply inert gas at a second flow rate into the substrate container, the second flow rate being lower than the first flow rate.

(Supplementary Note 2)

The substrate processing apparatus of Supplementary Note 1 further includes a substrate container opening/closing part configured to open and close the substrate container; and a substrate container storing shelf configured to store the substrate container, wherein the first purging part may be installed in the substrate container opening/closing part and the second purging part may be installed in the substrate container storing shelf (Supplementary Note 3)

The substrate processing apparatus of Supplementary Note 1 further includes a substrate container transfer stand configured to hold the substrate container when the substrate container is transferred into the substrate processing apparatus; and a substrate container storing shelf configured to store the substrate container, wherein the first purging part may be installed in the substrate container transfer stand and the second purging part is installed in the substrate container storing shelf.

(Supplementary Note 4)

The substrate processing apparatus of any one of Supplementary Notes 1 to 3 further includes a substrate container transfer device configured to transfer the substrate container; a transfer control part configured to control the substrate container transfer device to transfer the substrate container from the first purging part to the second purging part; and a purge control part configured to control the first purging part to perform the first purge when the substrate container is in the first purging part and control the second purging part to perform the second purge when the substrate container is transferred from the first purging part to the second purging part.

(Supplementary Note 5)

The substrate processing apparatus of Supplementary Note 1 or 2 further includes a substrate container transfer device configured to transfer the substrate container; a transfer control part configured to control the substrate container transfer device to transfer the substrate container to the first purging part and transfer the substrate container from the first purging part to the second purging part when the substrate container is transferred into the substrate processing apparatus; and a purge control part configured to control the first purging part to perform the first purge when the substrate container is transferred to the first purging part and control the second purge part to perform the second purge when the substrate container is transferred from the first purging part to the second purging part.

(Supplementary Note 6)

In the substrate processing apparatus of any one of Supplementary Notes 1 to 5, the first purging part may be configured to reduce oxygen concentration within the substrate container to a first control value or less by supplying the inert gas at the first flow rate into the substrate container and the second purging part is configured to keep the oxygen concentration within the substrate container at a second control value or less by supplying the inert gas at the second flow rate into the substrate container.

(Supplementary Note 7)

In the substrate processing apparatus of Supplementary Note 6, the second control value may be an oxygen concentration value higher than the first control value.

(Supplementary Note 8)

Another aspect of the present disclosure provides a substrate processing apparatus including a processing vessel configured to process a substrate; a first purging part configured to purge a substrate container accommodating the substrate; a substrate container transfer device configured to transfer the substrate container; a substrate container transfer chamber in which the substrate container transfer device is installed; a substrate container opening/closing part configured to open and close the substrate container; and a control part configured to control the first purging part to purge the substrate container so that oxygen concentration within the substrate container may be set to a predetermined control value or less in the first purging part when the substrate container is transferred from the first purging part to the substrate container opening/closing part.

(Supplementary Note 9)

The substrate processing apparatus of Supplementary Note 8 further includes a second purging part which is installed in the substrate container transfer chamber and configured to purge the substrate container.

(Supplementary Note 10)

In the substrate processing apparatus of Supplementary Note 9, the predetermined control value includes a first control value and a second control value which is higher than the first control value.

(Supplementary Note 11)

In the substrate processing apparatus of any one of Supplementary Notes 8 to 10, the control part may be configured to control the first purging part to reduce the oxygen concentration of the substrate container to the first control value or less and control the second purging part to keep the substrate container at the second control value or less.

(Supplementary Note 12)

In the substrate processing apparatus of Supplementary Note 11, the control part may be configured to control the first purging part to set the substrate container to the first control value when the substrate container is transferred from the first purging part to the second purging part.

(Supplementary Note 13)

In the substrate processing apparatus of any one of Supplementary Notes 6 and 10 to 12, the first control value is 600 ppm and the second control value is equal to or more than 600 ppm and equal to or less than 1,000 ppm.

(Supplementary Note 14)

In the substrate processing apparatus of any one of Supplementary Notes 1 to 7 and 9 to 13, a main purging port installed in the first purging part supplies gas at a first flow rate into the substrate container and a sub-purging port installed in the second purging part supplies gas at a second flow rate into the substrate container.

(Supplementary Note 15)

In the substrate processing apparatus of Supplementary Note 14, the first flow rate may be higher than the second flow rate.

(Supplementary Note 16)

In the substrate processing apparatus of Supplementary Note 15, the first flow rate may be greater than or equal to 20 slm and less than or equal to 100 slm, and the second flow rate may be greater than or equal to 0.5 slm and less than or equal to 20 slm.

(Supplementary Note 17)

Another aspect of the present disclosure provides a purging apparatus including a first purging part configured to perform a first purge to supply inert gas at a first flow rate into a substrate container accommodating a substrate; and a second purging part configured to perform a second purge to supply inert gas at a second flow rate into the substrate container, the second flow rate being lower than the first flow rate.

(Supplementary Note 18)

In the purging apparatus of Supplementary Note 17, the first purging part may be installed in a substrate container opening/closing part, which is installed in a substrate processing apparatus and configured to open and close the substrate container, and the second purging part may be installed in a substrate container storing shelf, which is installed in the substrate processing apparatus and configured to store the substrate container.

(Supplementary Note 19)

In the purging apparatus of Supplementary Note 17, the first purging part may be installed in a substrate container transfer stand, which is installed in a substrate processing apparatus and configured to hold the substrate container when the substrate container is transferred into the substrate processing apparatus, and the second purging part may be installed in a substrate container storing shelf, which is installed in the substrate processing apparatus and configured to store the substrate container.

(Supplementary Note 20)

Another aspect of the present disclosure provides a method of manufacturing a semiconductor device, including performing a first purge in a first purging part to supply inert gas at a first flow rate into a substrate container containing a substrate; transferring the substrate container from the first purging part to a second purging part; and performing a second purge in the second purging part to supply inert gas at a second flow rate into the substrate container, the second flow rate being lower than the first flow rate.

(Supplementary Note 21)

In the method of Supplementary Note 20, the act of performing the first purge includes reducing oxygen concentration within the substrate container to a first control value or less by supplying the inert gas at the first flow rate into the substrate container, and the act of performing the second purge includes keeping the oxygen concentration within the substrate container at a second control value or less by supplying the inert gas at the second flow rate into the substrate container.

(Supplementary Note 22)

In the method of Supplementary Note 21, the second control value may be an oxygen concentration value higher than the first control value.

(Supplementary Note 23)

Another aspect of the present disclosure provides a method of manufacturing a semiconductor device, including transferring a substrate from a substrate container transfer chamber, in which a substrate container is transferred, to a substrate transfer chamber via a substrate container opening/closing device; transferring the substrate from the substrate transfer chamber to a processing chamber; and purging the substrate container before the substrate container is transferred to the substrate container opening/closing device so that oxygen concentration within the substrate container is set to a first control value or less.

(Supplementary Note 24)

Another aspect of the present disclosure provides a non-transitory computer-readable recording medium storing a program that causes a computer to perform a process including performing a first purge in a first purging part to supply inert gas at a first flow rate into a substrate container containing a substrate; transferring the substrate container from the first purging part to a second purging part; and performing a second purge in the second purging part to supply inert gas at a second flow rate into the substrate container, the second flow rate being lower than the first flow rate.

(Supplementary Note 25)

Another aspect of the present disclosure provides a non-transitory computer-readable recording medium storing a program that causes a computer to perform a process including transferring a substrate from a substrate container transfer chamber, in which a substrate container is transferred, to a substrate transfer chamber via a substrate container opening/closing device; transferring the substrate from the substrate transfer chamber to a processing vessel; and purging the substrate container before the substrate container is transferred to the substrate container opening/closing device so that oxygen concentration within the substrate container is set to a first control value or less.

According to the present disclosure in some embodiments, it is possible to provide a substrate processing apparatus, a purging apparatus, a method of manufacturing a semiconductor device, and a recording medium, which are capable of improving manufacture quality, characteristics and throughput of semiconductor devices.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions, combinations and changes in the form of the embodiments described herein may be made without departing from the spirit of the disclosures. The accompanying claims and their equivalents are intended to cover such forms, combinations or modifications as would fall within the scope and spirit of the disclosures.

What is claimed is:

1. A substrate processing apparatus comprising:
   a processing vessel configured to process a substrate;
   a substrate container transfer stand configured to transfer a substrate container accommodating the substrate into and out of a transfer chamber;
   a substrate container opening/closing part configured to open and close a cover of the substrate container;
   a substrate container storing shelf configured to store the substrate container;
   a first purging part controlled by a first controller to perform a first purge to supply inert gas at a first flow rate into the substrate container mounted on the substrate container transfer stand or the substrate container opening/closing part, wherein the first purging part is installed in at least one of the substrate container transfer stand and the substrate container opening/closing part; and
   a second purging part controlled by a second controller to perform a second purge to supply inert gas at a second flow rate into the substrate container mounted on the substrate container storing shelf, the second flow rate being lower than the first flow rate, wherein the second purging part is installed in the substrate container storing shelf.

2. The substrate processing apparatus of claim 1, further comprising:
   a substrate container transfer device configured to transfer the substrate container;
   a transfer control part electrically connected to the substrate container transfer device and configured to control the substrate container transfer device to transfer the substrate container from the first purging part to the second purging part; and
   a purge control part configured to control the first purging part to perform the first purge when the substrate container is in the first purging part and control the second purging part to perform the second purge when the substrate container is transferred from the first purging part to the second purging part.

3. The substrate processing apparatus of claim 1, further comprising:
a substrate container transfer device configured to transfer the substrate container;
a transfer control part electrically connected to the substrate container transfer device and configured to control the substrate container transfer device to transfer the substrate container to the first purging part and transfer the substrate container from the first purging part to the second purging part, when the substrate container is transferred into the substrate processing apparatus; and
a purge control part configured to control the first purging part to perform the first purge when the substrate container is transferred to the first purging part and control the second purging part to perform the second purge when the substrate container is transferred from the first purging part to the second purging part.

4. The substrate processing apparatus of claim 1, wherein the first purging part is configured to reduce oxygen concentration within the substrate container to a first control value or less by supplying the inert gas at the first flow rate into the substrate container, and the second purging part is configured to keep the oxygen concentration within the substrate container at a second control value or less by supplying the inert gas at the second flow rate into the substrate container.

5. The substrate processing apparatus of claim 4, wherein the second control value is an oxygen concentration value higher than the first control value.

6. The substrate processing apparatus of claim 4, wherein the first control value is 600 ppm, and the second control value is equal to or more than 600 ppm and equal to or less than 1,000 ppm.

7. The substrate processing apparatus of claim 1, wherein the first flow rate is greater than or equal to 20 slm and less than or equal to 100 slm, and the second flow rate is greater than or equal to 0.5 slm and less than or equal to 20 slm.

8. The substrate processing apparatus of claim 1, wherein the first purging part includes:
a first gas supplying hole configured to supply inert gas at the first flow rate into the substrate container; and
a first gas exhaust hole configured to exhaust an internal atmosphere of the substrate container,
wherein the second purging part includes:
a second gas supplying hole configured to supply inert gas at the second flow rate into the substrate container, the second flow rate being lower than the first flow rate; and
a second gas exhaust hole configured to exhaust an internal atmosphere of the substrate container.

9. A purging apparatus comprising:
a first purging part controlled by a first controller to perform a first purge to supply inert gas at a first flow rate into a substrate container mounted on a substrate container transfer stand or a substrate container opening/closing part, wherein the first purging part is installed in at least one of the substrate container transfer stand and the substrate container opening/closing part, the substrate container transfer stand is installed in a substrate processing apparatus and is configured to transfer the substrate container accommodating a substrate into and out of the substrate processing apparatus, and the substrate container opening/closing part is installed in the substrate processing apparatus and is configured to open and close the substrate container; and
a second purging part controlled by a second controller to perform a second purge to supply inert gas at a second flow rate into the substrate container mounted on a substrate container storing shelf, the second flow rate being lower than the first flow rate, wherein the second purging part is installed the substrate container storing shelf, and the substrate container storing shelf is installed in the substrate processing apparatus and is configured to store the substrate container.

10. A method of manufacturing a semiconductor device, comprising:
performing a first purge to supply inert gas at a first flow rate into a substrate container mounted on a substrate container transfer stand or a substrate container opening/closing part, wherein the first purging part is installed in at least one of the substrate container transfer stand and the substrate container opening/closing part, and the substrate container transfer stand is installed in a substrate processing apparatus and is configured to transfer the substrate container accommodating a substrate into and out of the substrate processing apparatus;
transferring the substrate container from a first purging part to a second purging part, wherein the second purging part is installed in the substrate container storing shelf, and the substrate container storing shelf is configured to store the substrate container; and
performing a second purge to supply inert gas at a second flow rate into the substrate container mounted on the substrate container storing shelf, the second flow rate being lower than the first flow rate.

11. The method of claim 10, wherein the act of performing the first purge comprises reducing oxygen concentration within the substrate container to a first control value or less by supplying the inert gas at the first flow rate into the substrate container, and the act of performing the second purge comprises keeping the oxygen concentration within the substrate container at a second control value or less by supplying the inert gas at the second flow rate into the substrate container.

12. A substrate processing apparatus comprising:
a transfer stand configured to transfer a pod accommodating a substrate into and out of a transfer chamber;
an opening/closing part configured to open and close a cover of the pod, wherein the opening/closing part is installed in the transfer chamber and is configured to mount the pod;
a storing shelf configured to store the substrate container, wherein the storing shelf is installed in the transfer chamber;
a first purging part controlled by a first controller to perform a first purge to supply inert gas at a first flow rate into the pod; and
a second purging part controlled by a second controller to perform a second purge to supply inert gas at a second flow rate into the substrate container, the second flow rate being lower than the first flow rate;
wherein the first purging part and the second purging part are located at different pod accommodating locations.

13. The substrate processing apparatus of claim 12, wherein the first purging part is installed in at least one of the transfer stand and the opening/closing part, and the second purging part is installed in the storing shelf.

* * * * *